(12) United States Patent
Liaw

(10) Patent No.: US 10,854,635 B2
(45) Date of Patent: Dec. 1, 2020

(54) SEMICONDUCTOR CIRCUIT WITH METAL STRUCTURE HAVING DIFFERENT PITCHES

(71) Applicant: Taiwan Semiconductor Manufacturing Co., Ltd., Hsin-Chu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/728,033

(22) Filed: Dec. 27, 2019

(65) Prior Publication Data

US 2020/0144294 A1     May 7, 2020

Related U.S. Application Data

(62) Division of application No. 15/964,216, filed on Apr. 27, 2018, now Pat. No. 10,756,114.

(Continued)

(51) Int. Cl.
*H01L 29/66* (2006.01)
*H01L 27/118* (2006.01)
(Continued)

(52) U.S. Cl.
CPC .... *H01L 27/11807* (2013.01); *H01L 23/5226* (2013.01); *H01L 27/0207* (2013.01);
(Continued)

(58) Field of Classification Search
CPC ........... H01L 27/11807; H01L 27/0207; H01L 23/5226; H01L 2027/11881;
(Continued)

(56) References Cited

U.S. PATENT DOCUMENTS 6,453,447 B1 * 9/2002 Gardner .................. G06F 30/39
716/103
7,667,271 B2  2/2010 Yu et al.
(Continued)

FOREIGN PATENT DOCUMENTS

CN     105762135      7/2016
JP     H0653408 A     2/1994
(Continued)

*Primary Examiner* — Mohammad M Hoque
(74) *Attorney, Agent, or Firm* — Haynes and Boone, LLP

(57) ABSTRACT

The semiconductor structure includes a semiconductor substrate having active regions; field-effect devices disposed on the semiconductor substrate, the field-effect devices including gate stacks with elongated shape oriented in a first direction; a first metal layer disposed over the gate stacks, the first metal layer including first metal lines oriented in a second direction being orthogonal to the first direction; a second metal layer disposed over the first metal layer, the second metal layer including second metal lines oriented in the first direction; and a third metal layer disposed over the second metal layer, the third metal layer including third metal lines oriented in the second direction. The first, second, and third metal lines have a first thickness $T_1$, a second thickness $T_2$, and t a third thickness $T_3$, respectively. The second thickness is greater than the first thickness and the third thickness.

20 Claims, 15 Drawing Sheets

Related U.S. Application Data

(60) Provisional application No. 62/611,037, filed on Dec. 28, 2017.

(51) Int. Cl.
  *H01L 23/522* (2006.01)
  *H01L 27/02* (2006.01)
  *H01L 23/532* (2006.01)

(52) U.S. Cl.
  CPC .. *H01L 23/53233* (2013.01); *H01L 23/53238* (2013.01); *H01L 23/53266* (2013.01); *H01L 2027/11812* (2013.01); *H01L 2027/11831* (2013.01); *H01L 2027/11837* (2013.01); *H01L 2027/11875* (2013.01); *H01L 2027/11881* (2013.01); *H01L 2027/11887* (2013.01); *H01L 2027/11888* (2013.01)

(58) Field of Classification Search
  CPC ..... H01L 23/53266; H01L 2027/11831; H01L 2027/11812; H01L 2027/11837; H01L 23/53238; H01L 23/53233; H01L 2027/11875; H01L 2027/11888; H01L 2027/11887
  USPC .......................................... 257/206
  See application file for complete search history.

(56) References Cited

U.S. PATENT DOCUMENTS

| | | | |
|---|---|---|---|
| 7,910,453 B2 | 3/2011 | Xu et al. | |
| 8,377,779 B1 | 2/2013 | Wang | |
| 8,399,931 B2 | 3/2013 | Liaw et al. | |
| 8,421,205 B2 | 4/2013 | Yang | |
| 8,652,894 B2 | 2/2014 | Lin et al. | |
| 8,661,389 B2 | 2/2014 | Chern et al. | |
| 8,686,516 B2 | 4/2014 | Chen et al. | |
| 8,698,205 B2 | 4/2014 | Tzeng et al. | |
| 8,716,765 B2 | 5/2014 | Wu et al. | |
| 8,723,272 B2 | 5/2014 | Liu et al. | |
| 8,729,627 B2 | 5/2014 | Cheng et al. | |
| 8,735,993 B2 | 5/2014 | Lo et al. | |
| 8,736,056 B2 | 5/2014 | Lee et al. | |
| 8,772,109 B2 | 7/2014 | Colinge | |
| 8,785,285 B2 | 7/2014 | Tsai et al. | |
| 8,816,444 B2 | 8/2014 | Wann et al. | |
| 8,823,065 B2 | 9/2014 | Wang et al. | |
| 8,826,212 B2 | 9/2014 | Yeh et al. | |
| 8,836,141 B2 | 9/2014 | Chi et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,251,888 B1 | 2/2016 | Liaw | |
| 9,520,482 B1 | 12/2016 | Chang et al. | |
| 9,576,814 B2 | 2/2017 | Wu et al. | |
| 2002/0190255 A1* | 12/2002 | Kitahara | H01L 27/0207 257/69 |
| 2005/0121793 A1 | 6/2005 | Liaw | |
| 2009/0140342 A1 | 6/2009 | Chakihara et al. | |
| 2011/0221067 A1* | 9/2011 | Ikegami | H01L 27/04 257/774 |
| 2013/0113112 A1* | 5/2013 | Tamaru | H01L 27/0207 257/774 |
| 2014/0001574 A1 | 1/2014 | Chen et al. | |
| 2014/0110755 A1 | 4/2014 | Colinge | |
| 2014/0151812 A1 | 6/2014 | Liaw | |
| 2014/0215420 A1 | 7/2014 | Lin et al. | |
| 2014/0264924 A1 | 9/2014 | Yu et al. | |
| 2014/0282289 A1 | 9/2014 | Hsu et al. | |
| 2014/0325466 A1 | 10/2014 | Ke et al. | |
| 2015/0221639 A1* | 8/2015 | Chen | G06F 30/39 257/368 |
| 2016/0117431 A1* | 4/2016 | Kim | G06F 30/392 716/119 |
| 2016/0181257 A1* | 6/2016 | Liaw | H01L 27/0207 257/401 |
| 2016/0190138 A1* | 6/2016 | Shimbo | H01L 27/0924 257/369 |
| 2016/0300826 A1 | 10/2016 | Lee et al. | |
| 2017/0005100 A1 | 1/2017 | Cho et al. | |
| 2017/0062475 A1* | 3/2017 | Song | H01L 28/00 |
| 2017/0170387 A1 | 6/2017 | Kim et al. | |
| 2017/0236885 A1 | 8/2017 | Koshihara et al. | |
| 2017/0287933 A1* | 10/2017 | Chen | H01L 29/0649 |
| 2018/0130786 A1* | 5/2018 | Deepak | H01L 27/0207 |
| 2018/0183414 A1* | 6/2018 | Guo | H03K 19/094 |
| 2018/0269152 A1* | 9/2018 | Sengupta | H01L 23/5286 |
| 2019/0006515 A1 | 1/2019 | Cheng et al. | |

FOREIGN PATENT DOCUMENTS

| | | |
|---|---|---|
| KR | 20030040061 A | 5/2003 |
| KR | 20110138135 A | 12/2011 |
| KR | 20170051270 A | 5/2017 |
| TW | 201234413 A | 8/2012 |
| TW | 201409665 A | 3/2014 |
| TW | 201421272 A | 6/2014 |
| TW | 201421472 A | 6/2014 |
| TW | 201633508 A | 6/2014 |
| TW | 201717395 A | 5/2017 |
| TW | 201738943 A | 11/2017 |

* cited by examiner

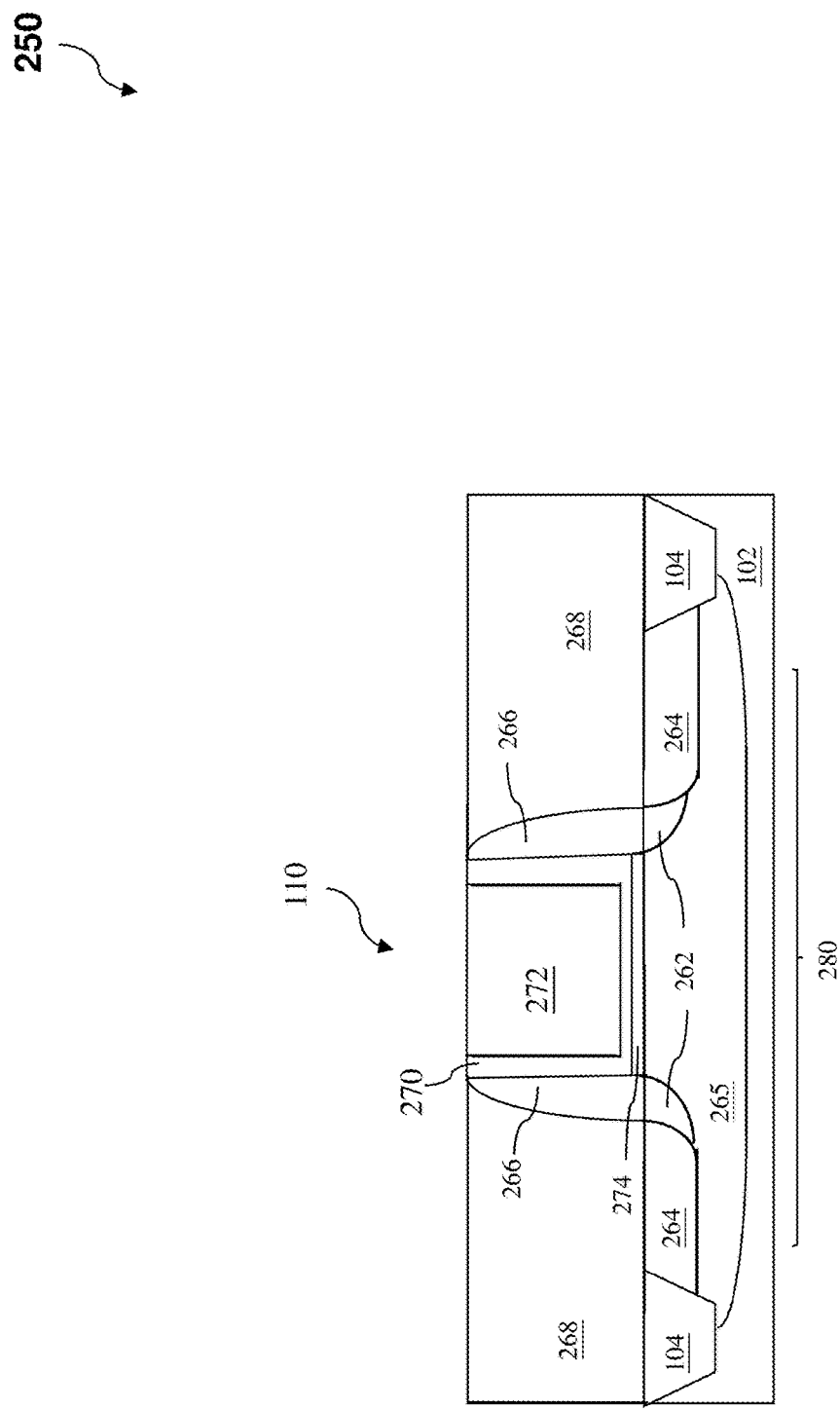

US 10,854,635 B2

SEMICONDUCTOR CIRCUIT WITH METAL STRUCTURE HAVING DIFFERENT PITCHES

PRIORITY DATA

The present application is a divisional application of U.S. patent application Ser. No. 15/964,216, files Apr. 27, 2018, which claims priority to U.S. Provisional Patent Application No. 62/611,037 filed Dec. 28, 2017, each of which is hereby incorporated by reference in its entirety.

BACKGROUND

In semiconductor process development, it is usually required wafer acceptance test (WAT) at a lower level metal layer (such as the $1^{st}$ or $2^{nd}$ level metal layer) to have quick feedback on both device performance and process margin. However, this will face a test robustness problem when the technology and metal pitcher continuously scale down to smaller feature sizes in advanced technology nodes. Therefore it requires the metal thickness (depth) thinner to maintain metal trench aspect ratio (depth/width) to have enough process margins for various fabrication processes (such as etching and metal deposition) during the formation of the corresponding metal layer. For example, during the formation of metal lines in this metal layer by a damascene process, it is challenge to etch an interlayer dielectric material to form trenches and vias with high aspect ratios when the metal layer is thick. Furthermore, it is challenge to deposit a metal in the trenches and/vias with high aspect ratio. On other side, a thinner metal layer easily causes WAT test failure due to various factors, such as high contact resistance or open, or probe punching through the test pads. Thinner metal layer is also conflicted with lower level metal test requirement.

Packing density is also a challenge when the semiconductor is scaled down to small feature sizes. For example, a logic circuit includes various logic gates, such as inverters, NAND gates, AND gates, NOR gates and flip-flop. In deep sub-micron integrated circuit technology, the logic circuit progressed to smaller feature sizes for higher packing density. However, the existing structure of a logic circuit still has various aspects to be improved for its performance and further enhanced packing density.

It is therefore desired to have an integrated circuit design and structure, and the method making the same to address the above issues with increased packing density.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 17 is a sectional view of the semiconductor structure of FIG. 1, in portion, constructed in accordance with some embodiments.

DETAILED DESCRIPTION

Figure 1:
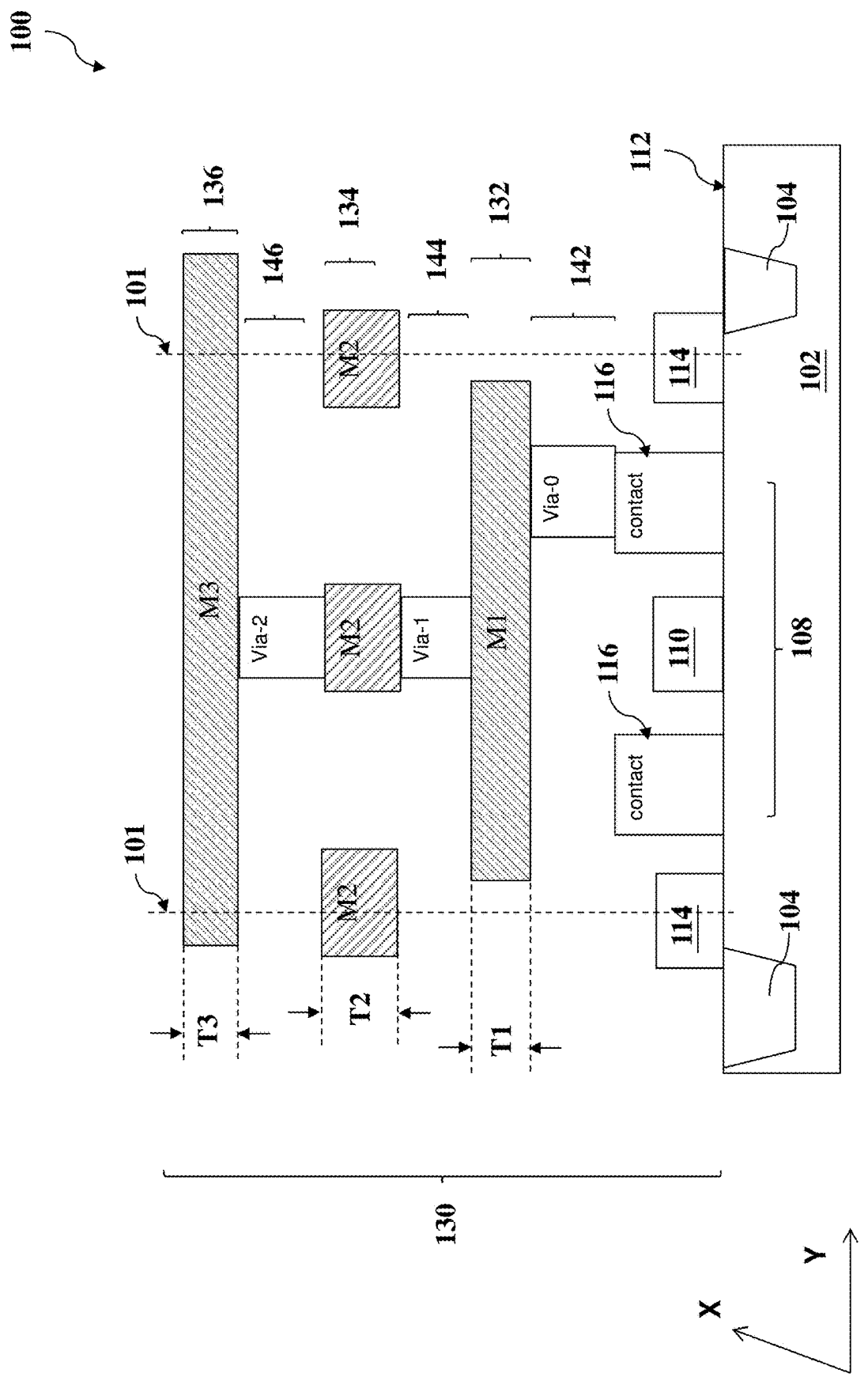
FIG. 1 is a sectional view of a semiconductor structure constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a sectional view of a semiconductor structure 100 constructed according to various aspects of the present disclosure in one embodiment. In some embodiments, the semiconductor structure 100 is formed on fin active regions and includes fin field-effect transistors (FinFETs). In some embodiments, the semiconductor structure 100 is formed on flat fin active regions and includes effect transistors (FETs). In various embodiments, the semiconductor structure 100 includes one or more standard cell to be incorporated and repeatedly used to integrated circuit designs. Those standard cells may include various basic circuit devices, such as inverter, NAND, NOR, AND, OR, and flip-flop, which are popular in digital circuit design for applications, such as central processing unit (CPU), graphic processing unit (GPU), and system on chip (SOC) chip designs. In the present embodiment, the semiconductor structure 100 includes a standard cell defined in the dashed lines 101.

The semiconductor structure 100 includes a semiconductor substrate 102. The semiconductor substrate 102 includes silicon. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions on the substrate 102, such as an active region 106. The isolation feature 104 utilizes isolation technology, such as shallow trench isolation (STI), to define and electrically isolate the various active regions. The isolation feature 104 includes silicon oxide, silicon nitride, silicon oxynitride, other suitable dielectric materials, or combinations thereof. The isolation feature 104 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multilayer structure, such as a thermal oxide liner layer and filling layer(s) of silicon nitride or silicon oxide.

The active region 106 is a region with semiconductor surface wherein various doped features are formed and configured to one or more device, such as a diode, a transistor, and/or other suitable devices. The active region may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility.

In some embodiments, the active region 106 is three-dimensional, such as a fin active region extended above the isolation feature 104. The fin active region is extruded from the substrate 102 and has a three-dimensional profile for more effective coupling between the channel and the gate electrode of a FET. The fin active region 106 may be formed by selective etching to recess the isolation features 104, or selective epitaxial growth to grow active regions with a semiconductor same or different from that of the substrate 102, or a combination thereof.

The semiconductor substrate 102 further includes various doped features, such as n-type doped wells, p-type doped wells, source and drain features, other doped features, or a combination thereof configured to form various devices or components of the devices, such as source and drain features of a field-effect transistor. The semiconductor structure 100 includes various IC devices 108 formed on the semiconductor substrate 102. The IC devices includes fin field-effect transistors (FinFETs), diodes, bipolar transistors, imaging sensors, resistors, capacitors, inductors, memory cells, or a combination thereof. In FIG. 1, exemplary FETs are provided only for illustration.

The semiconductor structure 100 further includes various gates (or gate stacks) 110 having elongated shape oriented in a first direction (X direction). In the present embodiment, X and Y directions are orthogonal and define a top surface 112 of the semiconductor substrate 102. A gate is a feature of a FET and functions with other features, such as source/drain (S/D) features and a channel, wherein the channel is in the active region and is directly underlying the gate; and the S/D features are in the active region and are disposed on two sides of the gate.

Figure 2:
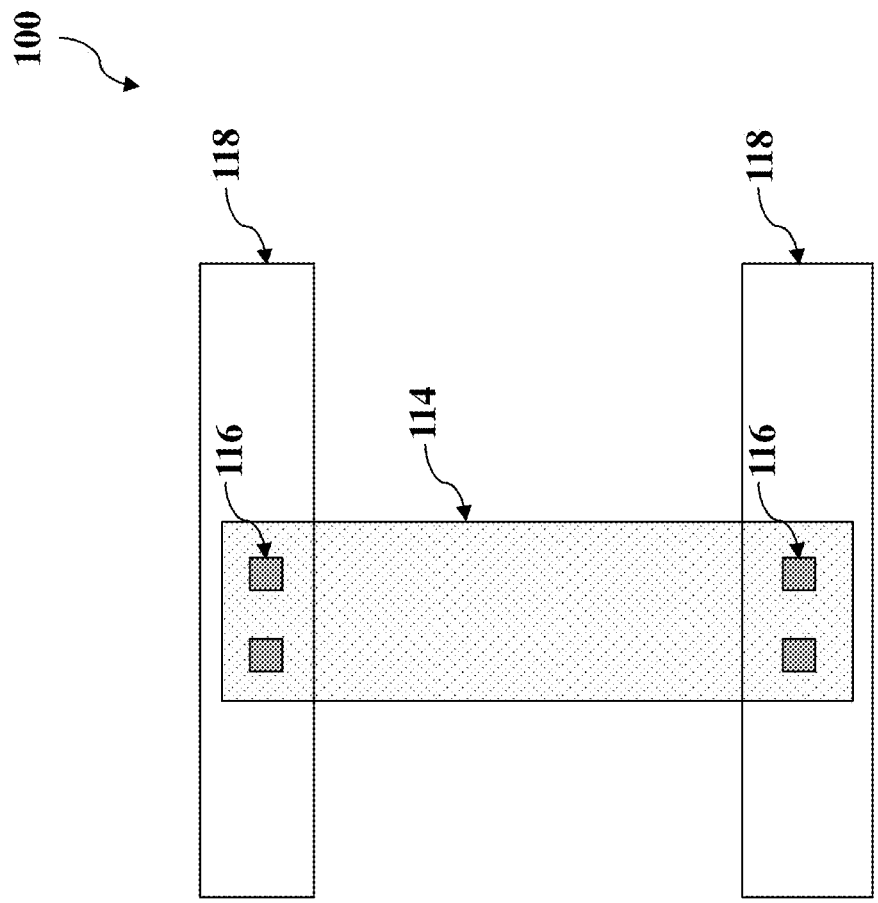
FIG. 2 is a top view of an interconnection gate and the metal lines in the semiconductor structure of FIG. 1, in accordance with some embodiments.

The semiconductor structure 100 also includes one or more interconnection gate 114 formed on the substrate 102. The interconnection gate 114 also has an elongated shape oriented in the X direction. The interconnection gate 114 is similar to the gate 110 in terms structure, composition and formation. For example, the gates 110 and the interconnection gate 114 are collectively and simultaneously formed by a same procedure, such as a gate-last process. However, the interconnection gate 114 is disposed and configured differently and therefore functions differently. In the present embodiment, the interconnection gate 114 is at least partially landing on the isolation feature 104. For example, the interconnection gate 114 is partially landing on the active region 106 and partially landing on the isolation feature 104. The interconnection gate 114 therefore provides isolation function between adjacent IC devices and additionally provides pattern density adjustment for improved fabrication, such as etching, deposition and chemical mechanical polishing (CMP). In the present embodiment, the interconnection gates 114 or a subset thereof are formed on the boundary lines between the adjacent standard cells. Furthermore, the interconnection gate 114 is connected to metal lines through gate contacts and therefore functions as a local interconnection as well. This is illustrated in FIG. 2 and described in details. FIG. 2 is a top view of the semiconductor structure 100, in portion, in accordance with some embodiments.

In FIG. 2, the contact features 116 are disposed on two ends of the interconnection gate 114 and directly landing on the interconnection gate 114. Those contacts 116 are further connected to metal lines 118. Thus, the interconnection gate 114 functions as a local interconnection feature to contribute to the interconnection structure, which will be further described later.

Figure 3:
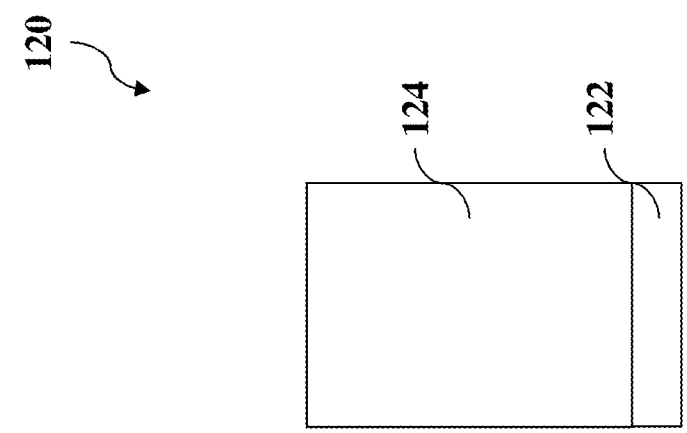

Referring back to FIG. 1, the gates 110 and the interconnection gate 114 have same compositions and formed by a same procedure. The structure of the gates 110 and the interconnection gates 114 is further described with reference to FIGS. 3-5 of a gate 120 in sectional view, according to various embodiments. The gate 120 represents both the gates 110 and the interconnection gate 114 since both are formed in a same procedure and have a same structure. The gate 120 includes a gate dielectric layer 122 (such as silicon oxide) and a gate electrode 124 (such as doped polysilicon) disposed on the gate dielectric layer, as illustrated in FIG. 3.

Figure 4:
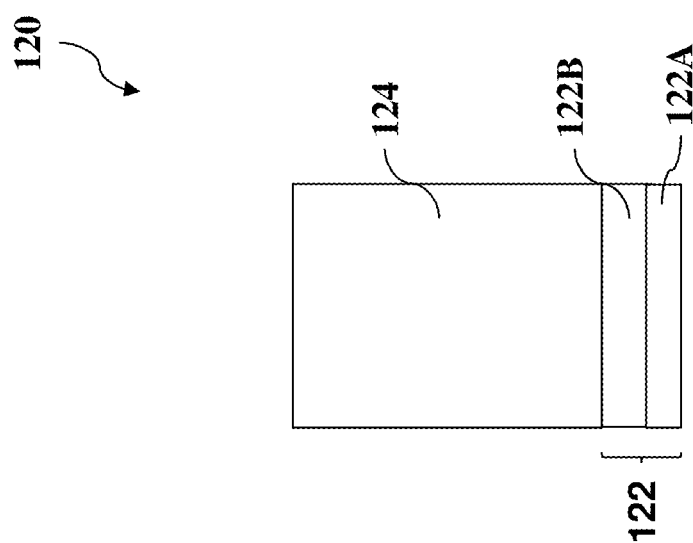

In some embodiments, the gate 120 alternatively or additionally includes other proper materials for circuit performance and manufacturing integration. For example, the gate dielectric layer 122 includes an interfacial layer 122A (such as silicon oxide) and a high k dielectric material layer 122B, as illustrated in FIG. 4. The high k dielectric material may include metal oxide, metal nitride or metal oxynitride. In various examples, the high k dielectric material layer includes metal oxide: ZrO2, Al2O3, and HfO2, formed by a suitable method, such as metal organic chemical vapor deposition (MOCVD), physical vapor deposition (PVD), atomic layer deposition (ALD), or molecular beam epitaxy (MBE). In some examples, the interfacial layer includes silicon oxide formed by ALD, thermal oxidation or ultra-violet-Ozone Oxidation. The gate electrode 124 includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). The multiple conductive films are designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

Figure 5:
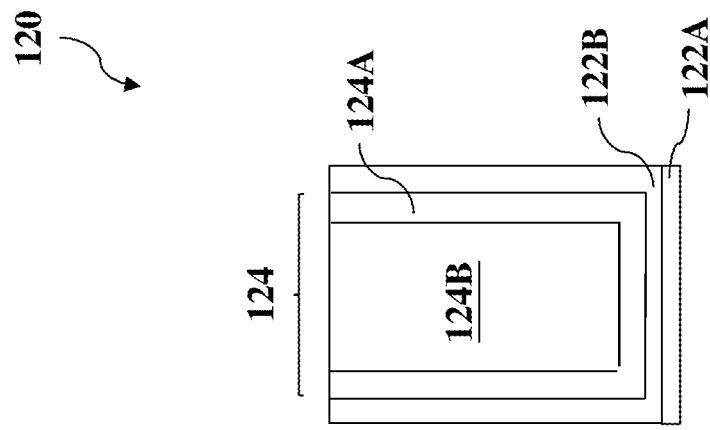
FIGS. 3, 4 and 5 are sectional views of a gate in the semiconductor structure of FIG. 1, in accordance with some embodiments.

In some embodiments illustrated in FIG. 5, the gate 120 is formed by a different method with a different structure. The gate may be formed by various deposition techniques and a proper procedure, such as gate-last process, wherein a dummy gate is first formed, and then is replaced by a metal gate after the formation the source and drain features. Alternatively, the gate is formed by a high-k-last a process, wherein the both gate dielectric material layer and the gate electrode are replaced by high k dielectric material and metal, respectively, after the formation of the source and drain features. In a high-k-last process, a dummy gate is first formed by deposition and patterning; then source/drain features are formed on gate sides and an inter-layer dielectric layer is formed on the substrate; the dummy gate is removed by etching to result in a gate trench; and then the gate material layers are deposited in the gate trench. In the present example, the gate electrode 124 includes a work function metal layer 124A and a filling metal, such as aluminum or copper. Thus formed gate 120 has various gate material layers U-shaped.

Referring back to FIG. 1, the semiconductor structure 100 also includes multilayer interconnection (MLI) structure 130 designed and configured to couple various field-effect transistors and other devices to form an integrated circuit having various logic gates, such as inverters, NAND gates, NOR gates, AND gates, OR gates, flip-flops, or a combination thereof. It is noted that various logic gates each may include multiple field-effect transistors and each FET includes a source, a drain and a gate 110. The gate 110 should not be confused with a logic gate. For clarification, sometime, the gate 110 is also referred to as transistor gate.

The MLI structure 130 includes a first metal layer 132, a second metal layer 134 over the first metal layer 132 and a third metal layer 136 over the second metal layer 134. Each metal layer includes a plurality of metal lines, such as first metal lines ("M1") in the first metal layer 132, second metal lines ("M2") in the second metal layer 134, and third metal lines ("M3") in the third metal layer 136. The MLI structure 130 may include more metal layers, such as a fourth metal layer, fifth metal layer, and so on. In the present embodiments, the metal lines in each layer are oriented in a same direction. Specifically, the first metal lines are oriented in the Y direction, the second metal lines are oriented in the X direction and the third metal lines are oriented in the X direction. The metal lines in different metal layers are connected through vertical conductive features (also referred to as vias or via features). The metal lines are further coupled to the semiconductor substrate 102 (such as source and drain features) through vertical conductive features. In the present embodiment, the S/D features are connected to the first metal lines through contact features ("contact") 116 and $0^{th}$ via features ("Via-0") 142. Furthermore, the first metal lines 132 are connected to the second metal lines 134 through first via features ("Via-1") 144; and the second metal lines 134 are connected to the third metal lines 136 through second vias features ("Via-2") 146.

Figure 7:
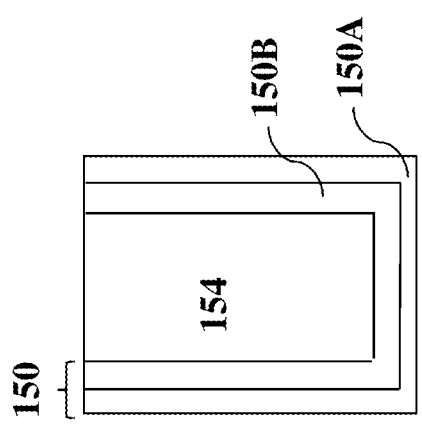
Figure 6:
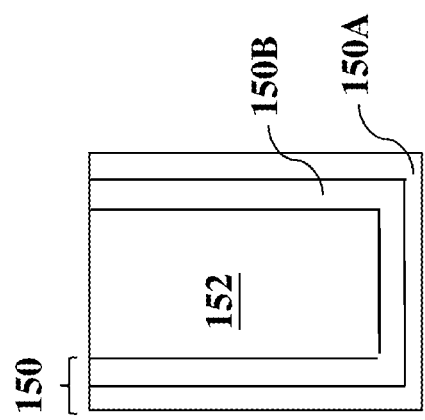
FIG. 6 is a sectional view of a contact in the semiconductor structure of FIG. 1, in accordance with some embodiments.

Among those contacts and via features, both the contacts 116 and the via-0 features 142 are conductive features to provide vertical interconnection paths between the substrate 102 and the first metal lines 132 but they are different in terms of composition and formation. The contacts 116 and the via-0 features 142 are formed separately. For examples, the contacts 114 are formed by a procedure that includes patterning an interlayer dielectric (ILD) layer to form contact holes; depositing to fill in the contact holes to form contacts; and may further include a chemical mechanical polishing (CMP) to remove the deposited metal materials from the ILD layer and planarize the top surface. The via-0 features 142 are formed by an independent procedure that includes a similar procedure to form the contacts 116 or alternatively a dual damascene process to collectively form the Via-0 features 142 and the first metal lines 132. In some embodiments, the contacts 116 include a barrier layer 150 and a first metal material layer 152, as illustrated in FIG. 6 in a sectional view; and the Via-0 features 142 include a barrier layer 150 and a second metal material layer 154, as illustrated in FIG. 7. In various examples, the barrier layer 150 includes titanium, titanium nitride, tantalum, tantalum nitride, other suitable material, or a combination thereof; the first metal material layer 152 includes cobalt; the second metal material layer 154 includes ruthenium, cobalt, copper, or a combination thereof. In the present embodiment, the barrier layer 150 includes a dual film scheme with a first barrier film 150A and a second barrier film 150B.

In one embodiment, the first metal material layer 152 includes cobalt; the second metal material layer includes tungsten; and the barrier layer 150 includes the first barrier film 150A of tantalum nitride and the second barrier film 150B of tantalum film. In another embodiment, the via-0 features 142 are collectively formed with the first metal lines 132 in a dual-damascene process, in which the via-0 features 142 (and the first metal lines 132 as well) include the barrier layer 150 and the second metal material layer 154 of copper (or copper aluminum alloy).

Figure 8:
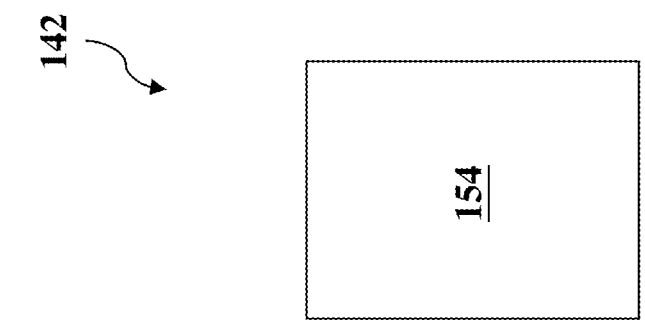
FIGS. 7 and 8 are sectional views of a via feature in the semiconductor structure of FIG. 1, in accordance with some embodiments.

In yet another embodiment, the via-0 features 142 include only tungsten, as illustrated in FIG. 8. In some other embodiments where both the via-0 features 142 and the first metal lines 132 are formed by a dual-damascene process, both the via-0 features 142 and the first metal lines 132 includes a material layer stack of a titanium nitride film, titanium film, and cobalt; or a material stack of a titanium nitride film, a titanium film, and a ruthenium film; or a material film stack of a tantalum nitride film and a copper film.

The semiconductor structure 100 also includes some test structures for wafer acceptance test (WAT). In the existing method, WAT test structures are formed on the first and/or second metal layers. However, as noted above, this has issues on test robustness when the technology and metal pitcher continuously scale down to smaller sizes in advanced technology nodes. When the metal layer is thick, trenches have aspect ratio (depth/width) too larger to be properly filled and it is also harder to etch a trench with a large aspect ratio. When the metal layer is thin, it can easily cause WAT test failure, such as high contact resistance or open, or probe punching through the test pads.

In the disclosed MLI structure 130, the metal layers are designed with the various parameters to overcome these concerns. In the MLI structure 130, various metal layers are designed with thicknesses, widths, and pitches to be compatible with test structure and have standard cells with improved packing density, which is described below in details. The metal lines in different layers have different dimensional parameters. Particularly, the first metal lines have a first thickness $T_1$, the second metal lines have a second thickness $T_2$, and the third metal lines have a third thickness $T_3$. The second thickness $T_2$ is greater than the first thickness $T_1$ and the third thickness $T_3$. In the present embodiment, a first thickness ratio $T_2/T_1$ and a second thickness ratio $T_2/T_3$ both are equal to or greater than 1.2; and a third thickness ratio $T_3/T_1$ is designed to be 1. In the disclosed structure, those parameters and other subsequently introduced parameters are provided with design values or ranges. The manufactured circuits may experience small variation, such as less than 5% variation. In some embodiments, the first thickness ratio $T_2/T_1$ and second thickness ratio $T_2/T_3$ both range between 1.2 and 2. In yet some other embodiments, the first thickness ratio $T_2/T_1$ and second thickness ratio $T_2/T_3$ both range between 1.3 and 1.8. The ratios are constrained in those ranges such that to effectively increase the routing efficiency and the chip packing density on one side and decrease the intra-cell coupling capacitance and the power lines resistance on another side.

Figure 9:
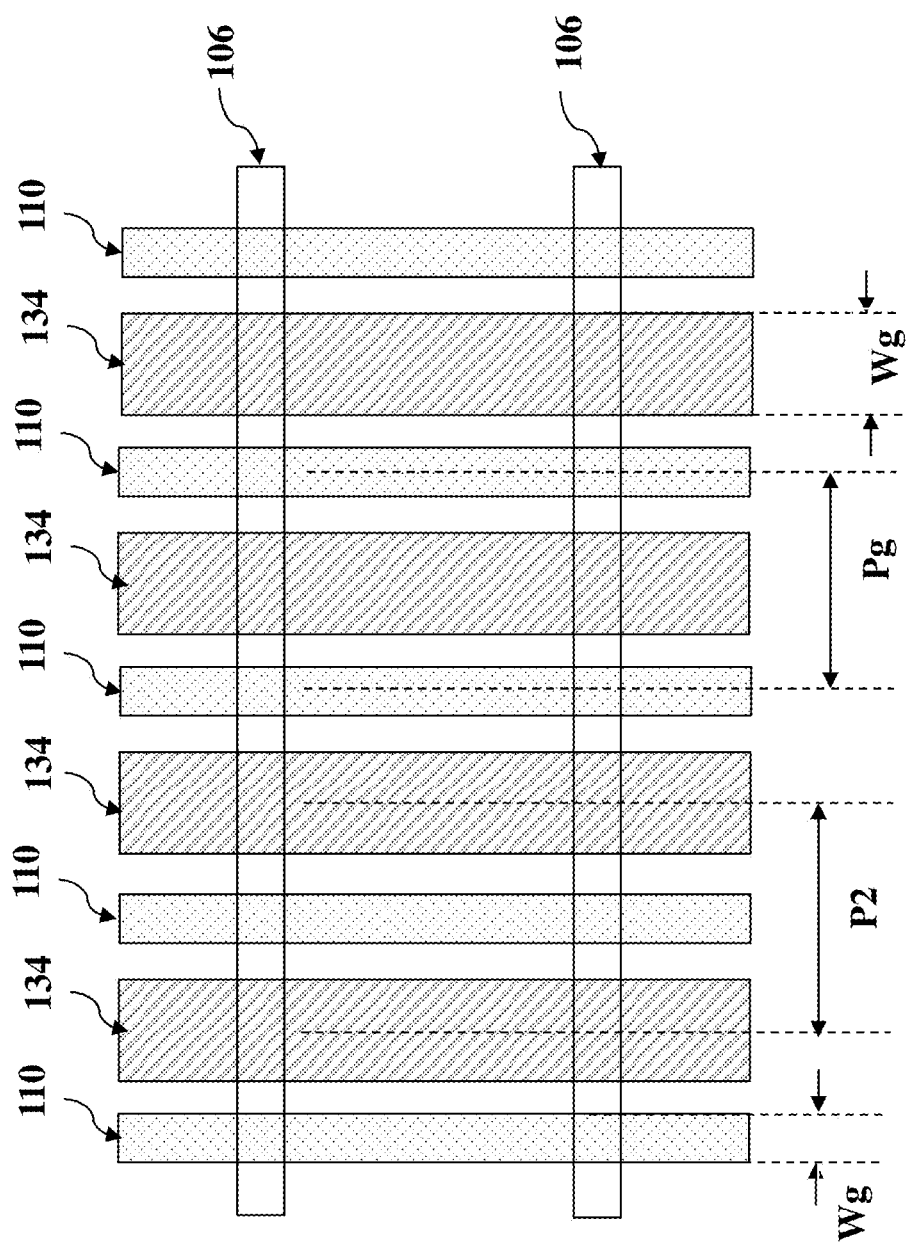
FIG. 9 is a top view of gate stacks and second metal lines constructed in accordance with some embodiments.

The pitches and widths of various features are further described below. The gates 110 have a minimum pitch $P_g$; the first metal lines 132 have a minimum pitch $P_1$; the second metal lines 134 have a minimum pitch $P_2$; and the third metal lines 136 have a minimum pitch $P_3$. The gates 110 have a width $W_g$; the first metal lines 132 have a width $W_1$; the second metal lines 134 have a width $W_2$; and the third metal lines 136 have a width $W_3$. The gates 114 and the second metal lines 134 are further illustrated in FIG. 9 in a top view. A pitch of features is defined as the dimension between two adjacent features (measured from same locations, such as center to center, or left edge to left edge). For examples, the gate pitch is the dimension from one gate to an adjacent gate, and the second metal line pitch is the dimension from one to an adjacent one of the second metal lines. Since pitch may not be a constant, the minimum pitch is defined and constrained above in the disclosed structure. Both the gates 110 and the second metal lines 134 are oriented in the X direction. The first metal lines and the third metal lines are oriented in the Y direction. In the present embodiment, the gates 114 and the second metal lines 134 have a same minimum pitch but different widths. Particularly, the first pitch ratio $P_g/P_2$ is 1 but $W_2$ usually does not equal to $W_g$; and the first metal lines 132 and the third metal lines 136 have a same minimum pitch or the second pitch ratio $P_3/P_1$ is 1 in other words. In some examples, the minimum pitch of the gates 110 is determined when the gates 110 and the interconnection gates 114 are collectively considered. Furthermore, the minimum pitch of the second metal lines 134 is greater than the minimum pitch $P_1$ of the first metal lines 132 and the minimum pitch $P_3$ of the third metal lines 136. A third pitch ratio $P_2/P_3$ ($P_2/P_1$ as well) is greater than 1. By utilizing the disclosed structure, the second metal lines 134 have a large thickness and large minimum pitch. Thus, the aspect ratio of the second metal lines 134 is reduced by the increased minimum pitch and the thickness of the second metal lines 134. The test structures formed in the second metal layer have WAT test robustness due to large thickness and enough processing margin due to the increased aspect ratio. In the present embodiment, the power lines (such as $V_{dd}$ and $V_{ss}$) are routed in the second metal lines 134, taking the advantages of the greater dimensions and less resistance of the second metal lines 134. The power line routing includes horizontal routing of the power lines being substantially distributed in the second metal lines 134.

Other advantages may present in various embodiments of the semiconductor structure 100. For examples, with the reduced thicknesses and pitches of the first metal lines 132 and the third metal lines 136; the routing efficiency is increased; the intra-cell coupling capacitance and the power lines resistance are reduced; chip packing density is increased; large pitches are minimized due to the minimum pitch of the second metal lines 134 are substantially aligned with that of the gates 110; and the circuit speed is improved.

Figure 10:
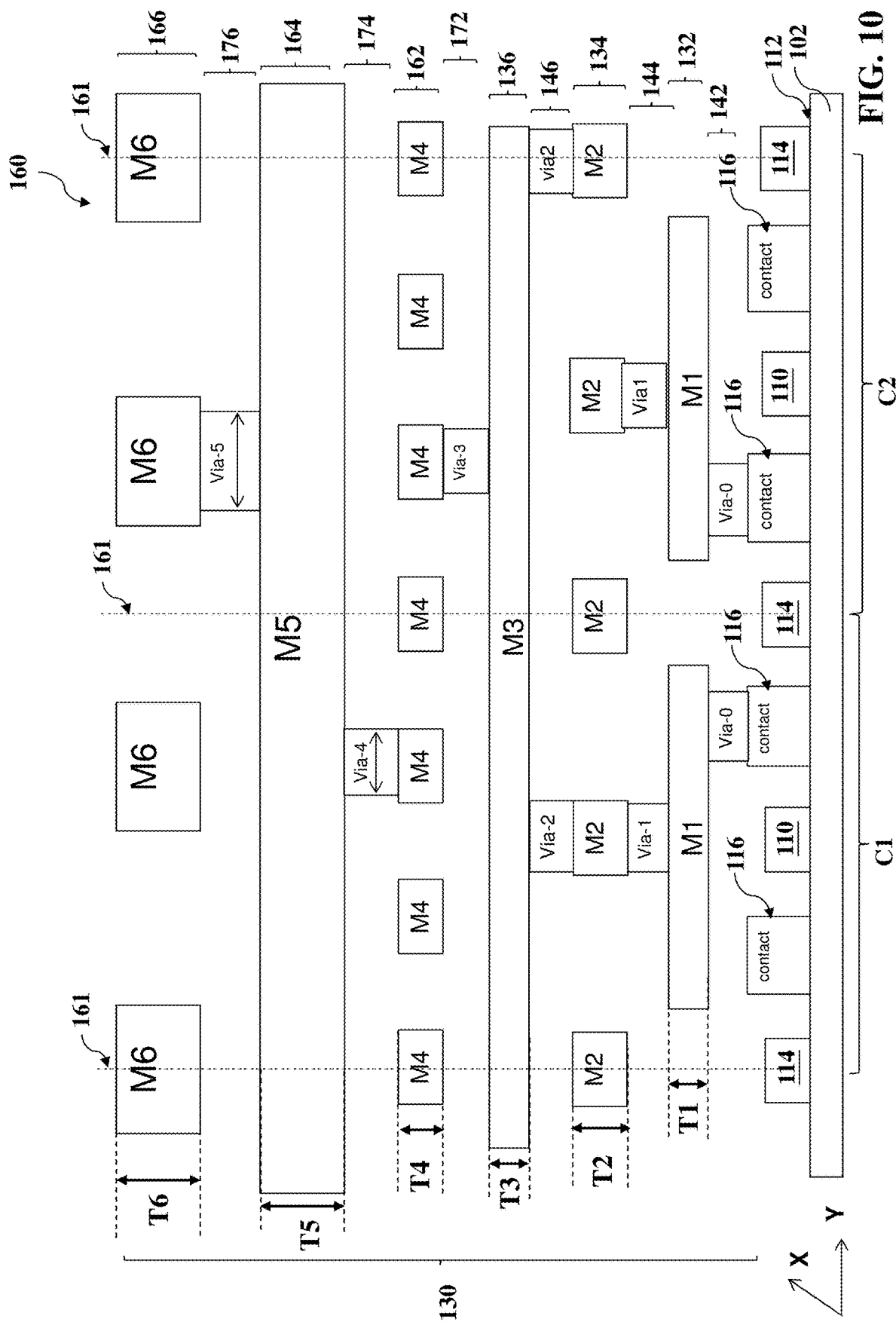
FIG. 10 is a sectional view of a semiconductor structure having at least six metal layers, in accordance with some embodiments.

FIG. 10 is a sectional view of a semiconductor structure 160 constructed according to various aspects of the present disclosure in one embodiment. The semiconductor structure 160 is similar to the semiconductor structure 100 in FIG. 1 but includes at least six metal layers.

In some embodiments, the semiconductor structure 160 is formed on fin active regions and includes FinFETs. In some embodiments, the semiconductor structure 160 is formed on flat active regions and includes FETs. In various embodiments, the semiconductor structure 160 includes one or more standard cell to be incorporated and repeatedly used in integrated circuit designs. In the present embodiment, the semiconductor structure 160 includes two standard cells ("C1" and "C2") defined by the dashed lines 161. Those standard cells may include various basic circuit devices, such as inverter, NAND, NOR, AND, OR, and flip-flop, which are popular in digital circuit design for applications, such as central processing unit (CPU), graphic processing unit (GPU), and system on chip (SOC) chip designs.

The metal lines in different layers have different dimensional parameters. Similar to the semiconductor structure 100, the semiconductor structure 160 includes the first metal lines 132, the second metal lines 134, the third metal lines 136 and the various contact and via features. Particularly, the first metal lines have a first thickness $T_1$, the second metal lines have a second thickness $T_2$, and the third metal lines have a third thickness $T_3$. The second thickness $T_2$ is greater than the first thickness $T_1$ and the third thickness $T_3$. In the present embodiment, a first thickness ratio $T_2/T_1$ and a second thickness ratio $T_2/T_3$ both are equal to or greater than 1.2; and a third thickness ratio $T_3/T_1$ is designed to be 1. In the disclosed structure, those parameters and other subsequently introduced parameters are provided with design values or ranges. The manufactured circuits may experience small variation, such as less than 5% variation. In some embodiments, the first thickness ratio $T_2/T_1$ and second thickness ratio $T_2/T_3$ both ranges between 1.2 and 2. In yet some other embodiments, the first thickness ratio $T_2/T_1$ and second thickness ratio $T_2/T_3$ both ranges between 1.3 and 1.8.

Furthermore, the gates 110 and the second metal lines 134 are aligned to have a same minimum pitch. Again the minimum pitch of the gates is determined when the gates 110 and interconnection gates 114 are collectively considered, according to some embodiments. In the present embodiment illustrated in FIG. 10, the interconnection gates 114 or a subset thereof are formed on the boundary lines 161 between the adjacent standard cells.

Furthermore, the semiconductor structure 160 includes a fourth metal lines 162, the fifth metal lines 164, the sixth metal lines 166 and the various via features, such as third via features 172, fourth via features 174, and fifth via features 176. Particularly, the fourth metal lines 162 have a fourth thickness $T_4$, the fifth metal lines 164 have a fifth thickness $T_5$, and the sixth metal lines have a sixth thickness $T_6$. The fifth thickness $T_5$ is designed to equal to the sixth thickness $T_6$. Again, the manufactured thickness may have certain variation, such as less than 5%. The fifth thickness $T_5$ is designed to be greater than the second thickness $T_2$. In the present embodiment, a thickness ratio $T_5/T_2$ is equal to or greater than 1.2.

The third via features ("Via-3") 172 have a width $Wv_3$, the fourth via features ("Via-4") 174 have a width $Wv_4$, and the fifth via features ("Via-5") 176 have a width $Wv_5$. In the present embodiment, the width $Wv_5$ is greater than the width $Wv_4$, such as with a ratio $Wv_5/Wv_4$ being 1.5 or greater to have increased packing density and decreased line resistance. In some embodiments, the via features in a same layer may have different width or variation. In this case, the above widths are minimum widths and the width ratio is the ratio of the corresponding minimum widths.

Figure 11A:
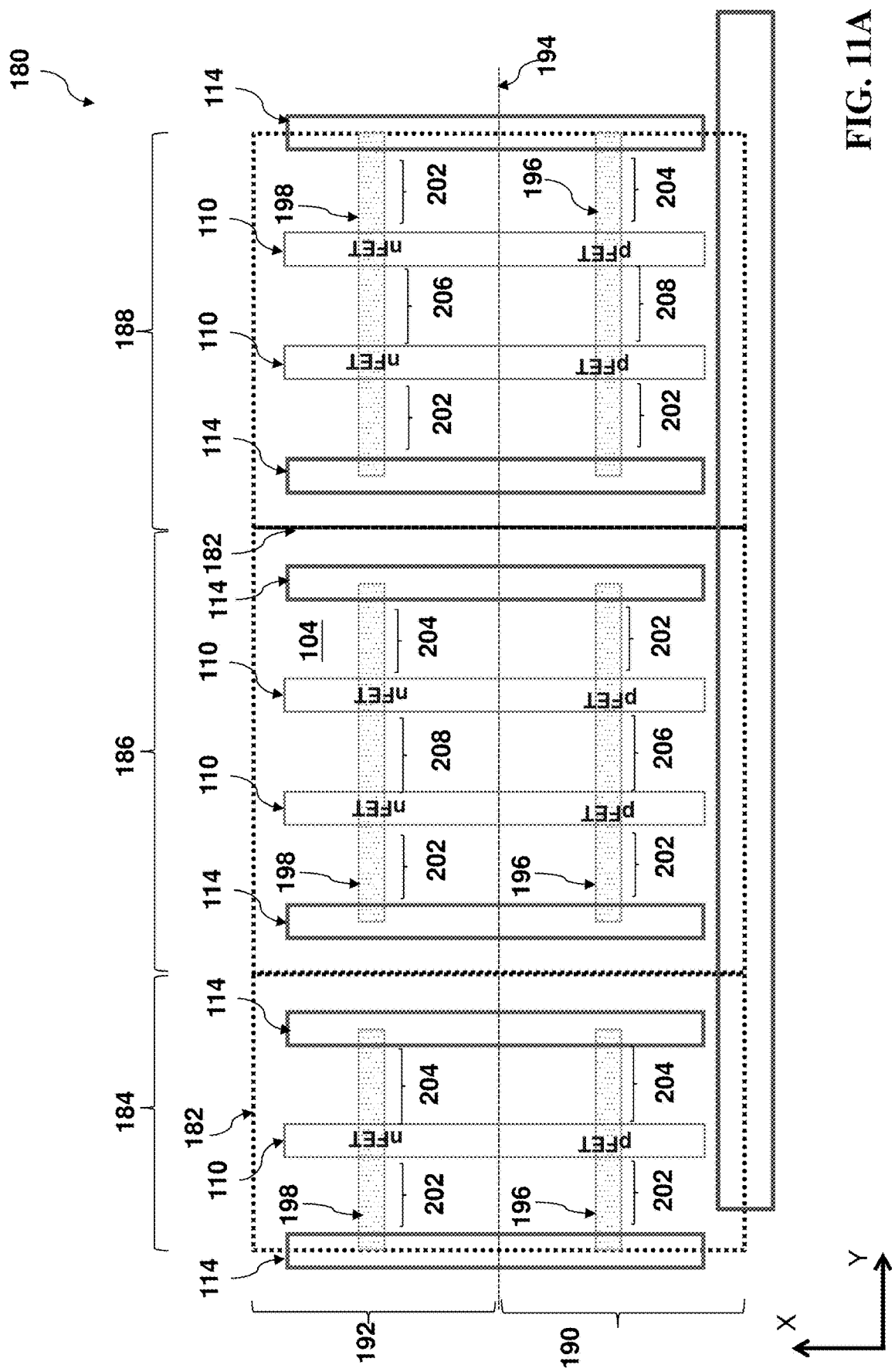
FIGS. 11A, 11B and 11C are top views of a semiconductor structure having an inverter, a logic NAND gate cell and a logic NOR gate cell, at various stages, in accordance with some embodiments.
Figure 11B:
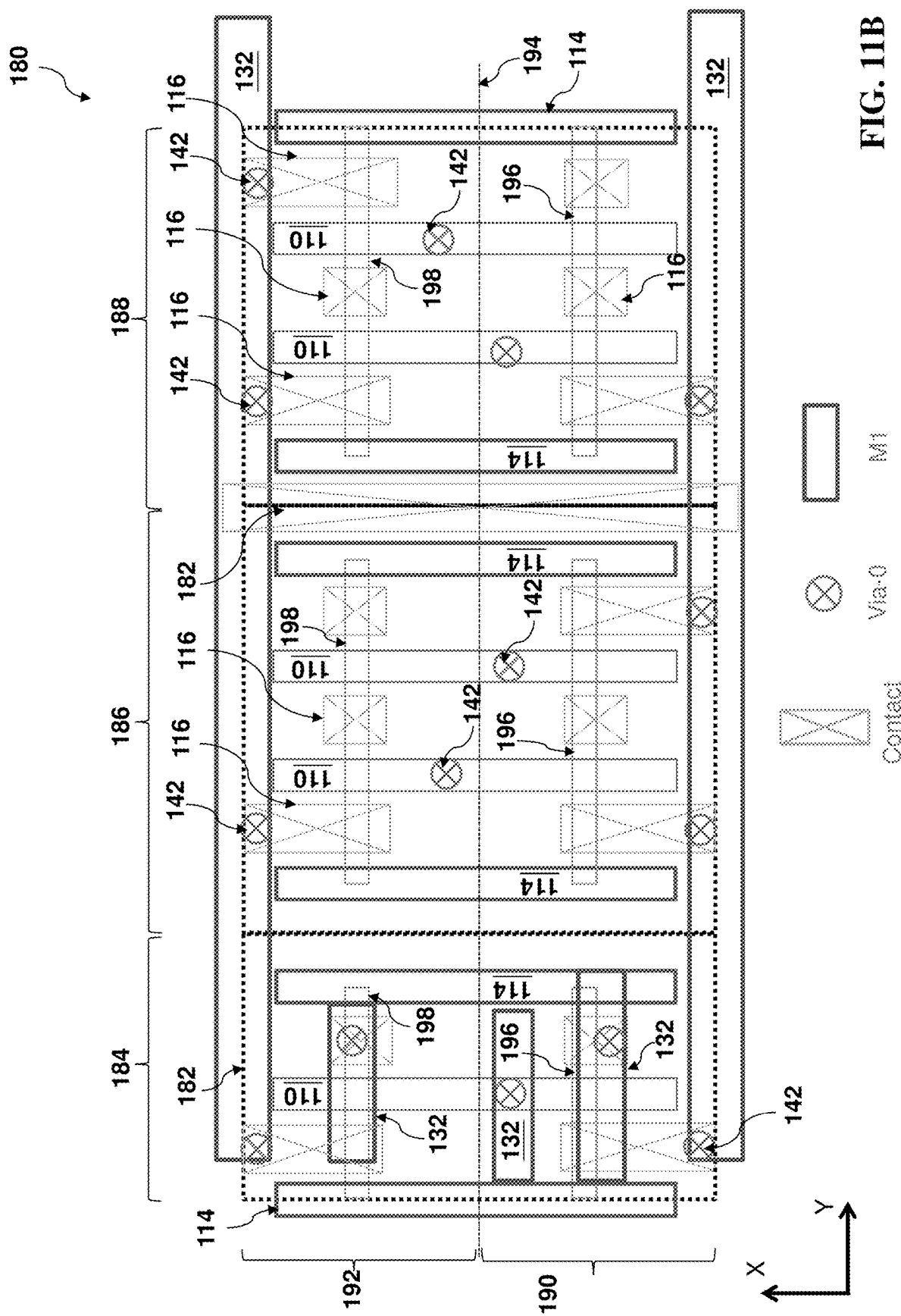
Figure 11C:
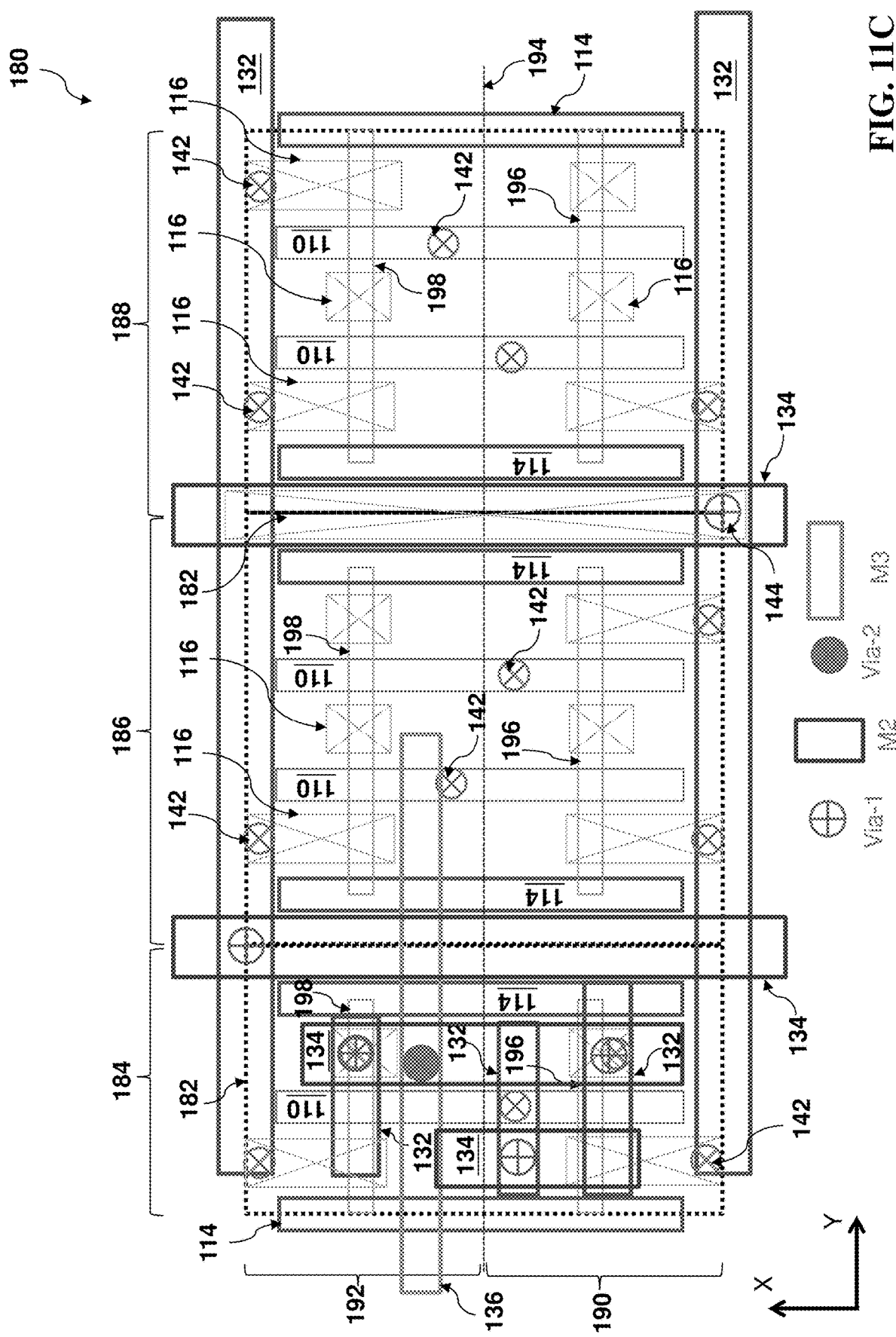

FIGS. 11A, 11B and 11C are top views of an integrated circuit 180 constructed according to various aspects of the present disclosure in one embodiment. As so many features are overlapped with each other, a first few layers (fin active regions and gates) are illustrated in FIG. 11A. The contact features 116, the via-0 features 142 and the first metal lines 132 are added to FIG. 11B. The via-1 features 144, the second metal lines 134, the via-2 features 146, and the third metal lines 136 are added to FIG. 11C. FIGS. 11A and 11B help comprehend various features and the layout of the integrated circuit 180. The integrated circuit 180 is one embodiment of the semiconductor structure 100 or the semiconductor structure 160. Various metal lines and gates are oriented, configured and designed with dimension as described in the semiconductor structure 100 or 160. For example, the thickness of the second metal lines 134 is greater than the thickness of the first metal lines 132 and the thickness of the third metal lines 136.

The integrated circuit 180 includes various standard cells configured in a layout illustrated in FIG. 11A. The integrated circuit 180 includes multiple standard cells integrated in a layout illustrated in FIG. 11A. The boundary lines of those standard cells are presented by the dashed lines 182. In the present embodiment, the integrated circuit 180 includes a first standard cell 184 having an inverter; a second standard cell 186 having an NAND logic gate; and a third standard cell 188 having a NOR logic gate. Each standard cell includes at least one nFET ("nFET") and at least one pFET ("pFET"). Note that a logic gate is a circuit including multiple devices (such as multiple FETs) and is different from a gate in a FET.

Referring back to FIG. 11A, various standard cells are configured side by side on the Y direction. The integrated circuit 180 includes an n-type doped well region (N-well) 190 and a p-type doped well region (P-well) 192, being separated by the dashed line 194. Fin active regions 196 and 198 are defined by and surrounded by the isolation features (such as STI features). Particularly, the fin active regions 196 are formed in the N-well 190 and the fin active regions 192 are formed in the P-well 192. Fin active regions 196 and 198 have elongated shapes and are oriented in the Y direction. Fin active regions 196 and 198 are designed with discontinuous structures so that each standard cell has its individual fin active region 196 in the N-well 190 and its individual fin active region 198 in the P-well 192, being separated from fin active regions in adjacent standard cells. Thus, the boundary lines between the adjacent standard cells are defined on the STI features. The integrated circuit 180 includes various gates (also referred to as gate stacks) 110 formed on the respective fin active regions 196 and 198. The gates 100 also have elongated shapes and are oriented in the X direction. The interconnection gates 114 are formed on the edges of the standard cells to provide isolations between the adjacent standard cells. Particularly, the interconnection gates 114 are at least partially landing on the STI features 104. Sources 202 and drains 204 are formed on the fin active regions on sides of the corresponding gates 110. As noted above, the NAND logic gate 186 and the NOR logic gate 188 each further include a common drain 206 and a common active region 208. The sources 202, drains 204, common drains 206 and common active regions 208 are formed by introducing dopants into the respective fin active regions using suitable technologies, such as ion implantation. In the present embodiment, the sources 202, drains 204, common drains 206 and common active regions 208 in the N-well 190 include p-type dopant, such as boron while the sources 202, drains 204, common drains 206 and common active regions 208 in the P-well 192 include n-type dopant, such as phosphorus.

Those fin active regions 196 and 198, gates 110, sources 202, drains 204, common drains 206 and common active regions 208 are configured to form various devices. For example, the inverter 184 includes a pFET within the N-well 190 and an nFET within the P-well 192; the NAND logic gate 186 includes two pFETs within the N-well 190 and two nFETs within the P-well 192; and the NOR logic gate 188 includes two pFETs within the N-well 190 and two nFETs within the P-well 192. For example, in the inverter standard cell 184, the fin active region 198, the source 202, the drain 204, and the gate 110 are configured to form an nFET in the P-Well 192. The integrated circuit 180 also includes various conductive features configured to connect those FETs into an inverter 184, an NAND logic gate 186 and an NOR logic gate 188. Particularly, the contact features 116, via-0 features 142 and the first metal lines 132 are further illustrated in FIG. 11B. For simplicity, the numerals for various doped features (such as sources and drains) are eliminated from FIG. 11B.

Referring to FIG. 11B, the contact features 116, the via-0 features 142, and the first metal lines 132 are formed thereon and configured to couple various FETs. The legends for the contact features ("contact") 116, the via-0 features ("Via-0") 142, and the first metal lines ("M1") 132 are provided in the bottom portion of FIG. 11B for better comprehending those features. The first metal lines 132 are connected to the sources and drains through the contact features 116 and the via-0 features 142. The first metal lines 132 are oriented in the Y direction.

Referring to FIG. 11C, the via-1 features 144, the second metal lines 134, the via-2 features 146, and the third metal lines 136 are further illustrated in FIG. 11C. The via-1 features 144, the second metal lines 134, the via-2 features 146, and the third metal lines 136 are formed thereon and connected to underlying features to the integrated circuit 180. The legends for the via-1 features ("Via-1") 144, the second metal lines ("M2") 134, the via-2 features ("Via-2") 146, and the third metal lines ("M3") 136 are provided in the bottom portion of FIG. 11C for better comprehending those features. The second metal lines 134 are connected to the first metal lines 132 through the via-1 features 144. The third metal lines 136 are connected to the second metal lines 134 through the via-2 features 146. The second metal lines 134 are oriented in the X direction and the third metal lines 136 are oriented in the Y direction.

As noted above, those gates, contact features, via features and metal lines are configured with dimensions, pitches, and width as described in the semiconductor structure of FIG. 1.

Figure 12:
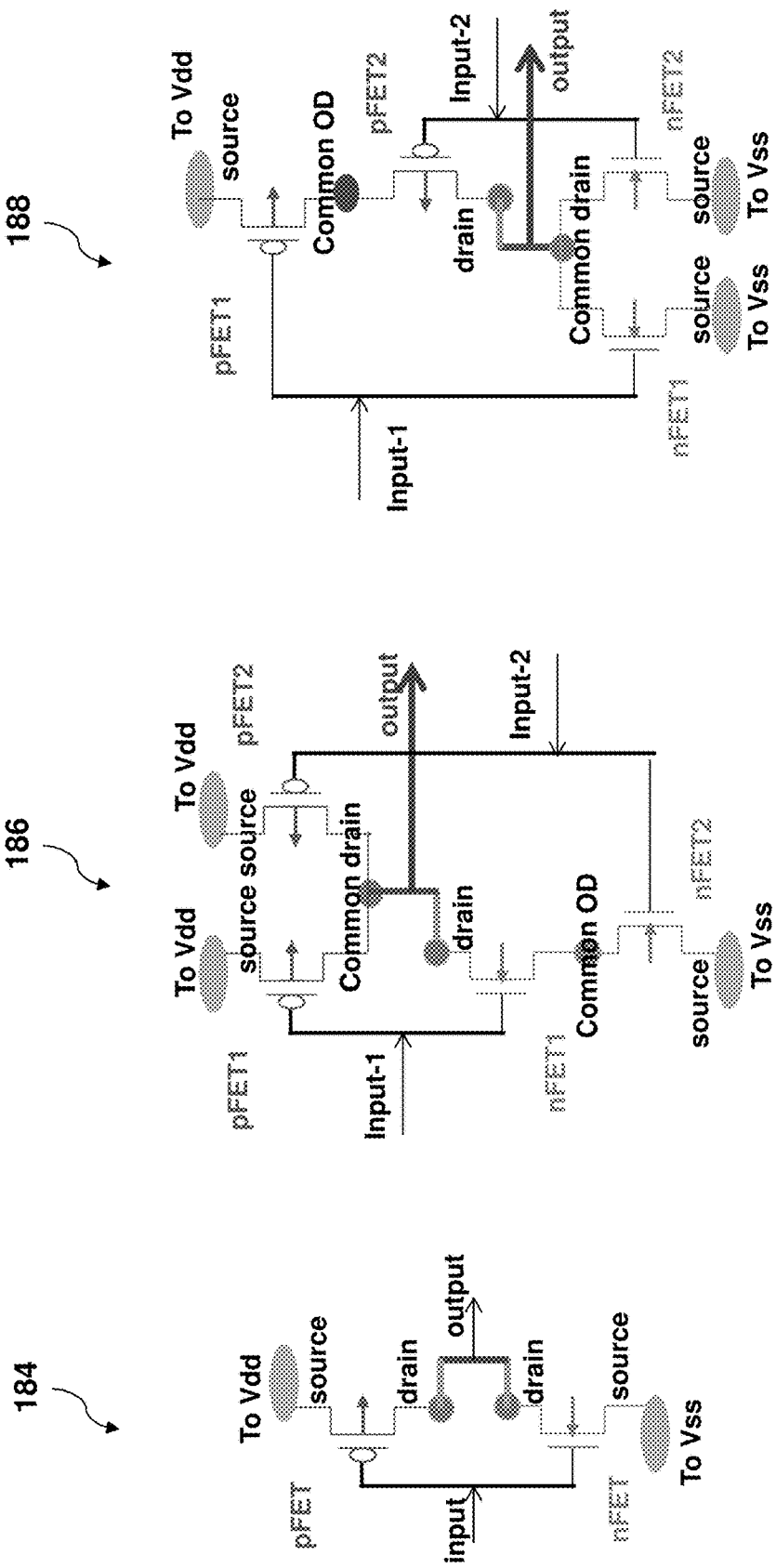
FIG. 12 is a schematic view of an inverter, a logic NAND gate and a logic NOR gate cell, in accordance with some embodiments.

Those contact features, via features and metal lines are routed to connect various gates, sources and drains to form various logic gates that include the inverter 184, NAND 186 and NOR 188. The Inverter 184, NAND 186 and NOR 188 are further illustrated in FIG. 12 in schematic view to show various connections. In the present embodiment, the inverter 184 includes one nFET and one pFET (labeled as "nFET" and "pFET", respectively, in FIG. 12); the NAND 186 includes two nFETs and two pFETs (labeled as "nFET1", "nFET2", "pFET1", and "pFET21", respectively, in FIG. 12); and the NOR 188 includes two nFETs and two pFETs (labeled as "nFET1", "nFET2", "pFET1", and "pFET21", respectively, in FIG. 12). Those nFETs and pFETs are connected as illustrated in FIG. 12 to form the inverter 184, NAND 186 and the NOR 188, respectively. Furthermore, each of the NAND 186 and NOR 188 includes a common drain and a common active region ("common OD"). High and low power lines are referred to as "Vdd" and "Vss", respectively, in FIG. 12.

Figure 13:
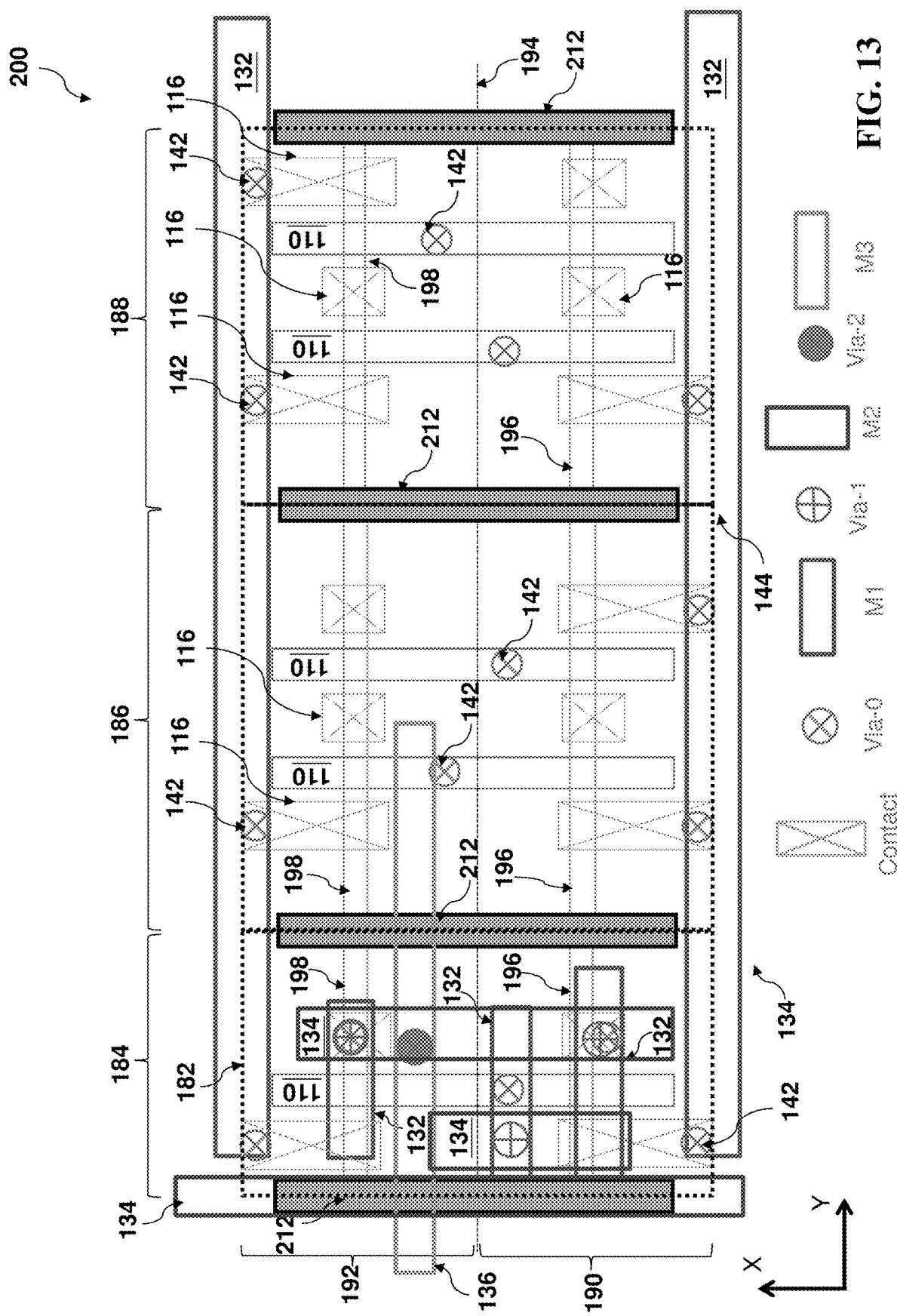
FIG. 13 is a top view of a semiconductor structure having an inverter, a logic NAND gate cell and a logic NOR gate cell, in accordance with some embodiments.

FIG. 13 is a top view of an integrated circuit 200 constructed according to various aspects of the present disclosure in one embodiment. The integrated circuit 200 is another embodiment of the semiconductor structure 100 or the semiconductor structure 160. Various metal lines and gates are oriented, configured and designed with dimension as described in the semiconductor structure 100 or 160. For example, the thickness of the second metal lines 134 is greater than the thickness of the first metal lines 132 and the thickness of the third metal lines 136.

The integrated circuit 200 includes various standard cells configured side by side along the Y direction. The integrated circuit 200 includes multiple standard cells with cell boundary lines presented by the dashed lines 182. In the present embodiment, the integrated circuit 200 includes a first standard cell 184 having an inverter; a second standard cell 186 having an NAND logic gate; and a third standard cell 188 having a NOR logic gate. The integrated circuit 200 is similar to the integrated circuit 180 of FIG. 11C but with some differences described below.

The interconnection gates 114 in the integrated circuit 180 of FIG. 11A are replaced by dielectric gates 212. The fin active regions 196 and 198 are still discontinuous structures. The dielectric gates 212 are formed on the cell boundary lines 182 and are landing on the STI features 104. The dielectric gates 212 provide isolation function to the adjacent standard cells. The dielectric gates 212 are dielectric features without electrical connection. The dielectric gates 212 include one or more suitable dielectric material, such as silicon oxide, silicon nitride, silicon oxynitride, low-k dielectric material, other suitable dielectric material, or a combination thereof. In some embodiments, the dielectric gates 212 are formed by a procedure described below. In the formation of the gates 110 (and the interconnection gates 114 as well), polysilicon gates are first formed by deposition and patterning (wherein the patterning further includes lithography process and etching); after the source and drain features are formed, and an interlayer dielectric material is deposited; and the polysilicon are replaced by metal gate. The dielectric gates 212 are formed in a similar procedure but the corresponding polysilicon gates are replaced separately by one or more dielectric material instead of conductive materials used to form the metal gates. Particularly, after the corresponding polysilicon gates are formed, the interlayer dielectric material is deposited; the polysilicon gates are removed by etching, forming gate trenches in the interlayer dielectric material; and the dielectric material(s) are deposited in the gate trenches to form dielectric gates 212.

A CMP process may be further applied to remove excessive dielectric material(s) on the interlayer dielectric material. So the dielectric gates 212 do not function as gates but as isolation features.

Figure 14:
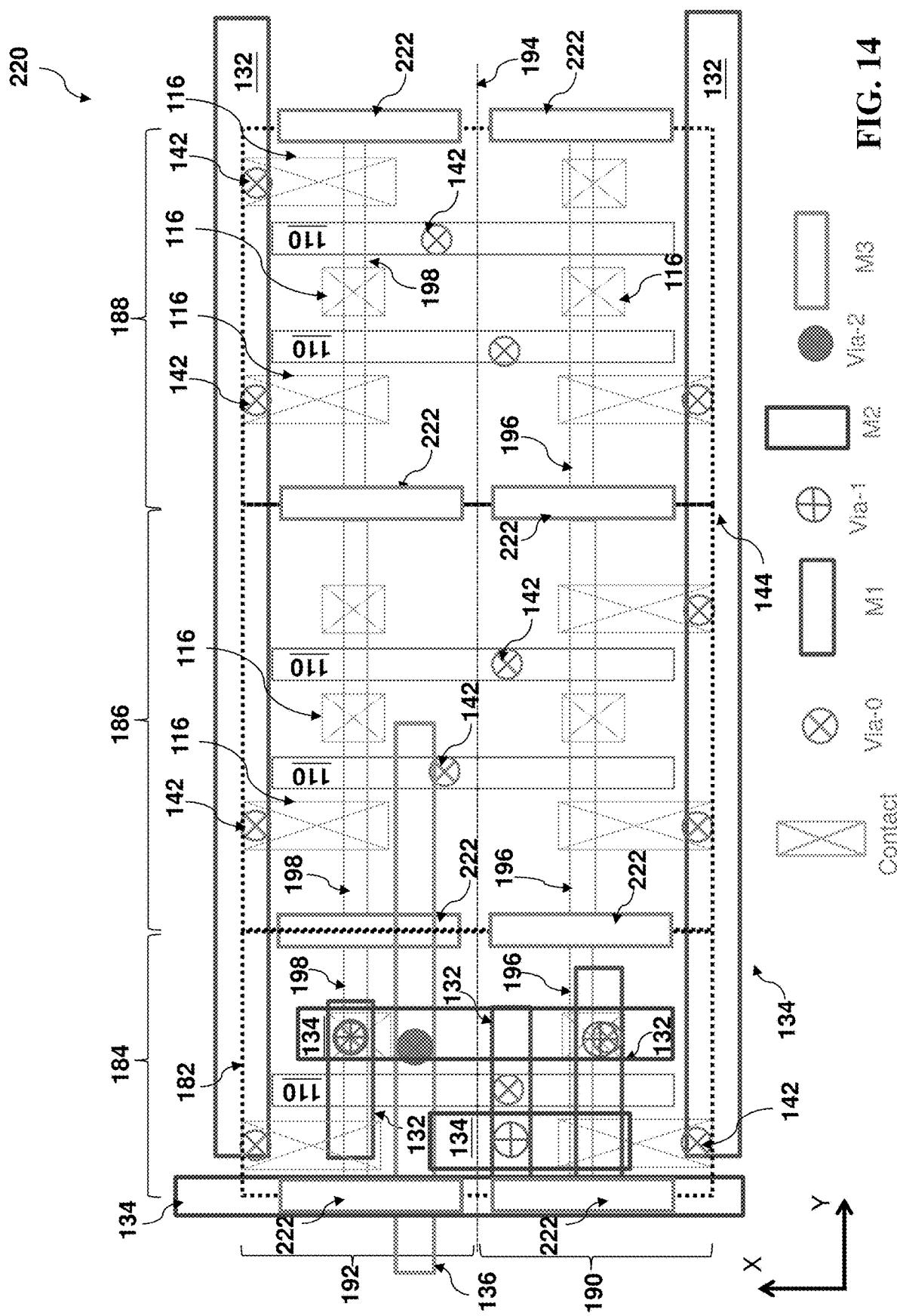
FIG. 14 is a top view of a semiconductor structure having an inverter in accordance with some embodiments.

FIG. 14 is a top view of an integrated circuit 220 constructed according to various aspects of the present disclosure in one embodiment. The integrated circuit 220 is another embodiment of the semiconductor structure 100 or the semiconductor structure 160. Various metal lines and gates are oriented, configured and designed with dimension as described in the semiconductor structure 100 or 160. For example, the thickness of the second metal lines 134 is greater than the thickness of the first metal lines 132 and the thickness of the third metal lines 136.

The integrated circuit 220 includes various standard cells configured side by side along the Y direction. The integrated circuit 220 includes multiple standard cells with cell boundary lines presented by the dashed lines 182. In the present embodiment, the integrated circuit 220 includes a first standard cell 184 having an inverter; a second standard cell 186 having an NAND logic gate; and a third standard cell 188 having a NOR logic gate. The integrated circuit 200 is similar to the integrated circuit 200 of FIG. 13 but with some differences described below.

Firstly, the fin active region 196 in the N-well 190 and the fin active region 198 in the P-well 192 are continuous structure and extend through multiple standard cells, such as through the inverter 184, the NAND logic gate 186 and the NOR logic gate 188 in the present example. The dielectric gates 212 in the integrated circuit 180 of FIG. 13 are replaced by gates 222. The gates 222 are functional gates, similar to the gates 110 in terms of formation and composition. For example, the gates 222 are simultaneously formed with the gates 110 in the same procedure that includes forming polysilicon gates, and then replacing the polysilicon gates with metal gates. The gates 222 also include high k dielectric material for gate dielectric and metal for gate electrode. However, the gates 222 are configured in the standard cell boundary lines to provide isolation between the adjacent standard cells and also referred to as isolation gates 222.

Secondly, since the fin active regions 196 and 198 are continuous structures, the gates 222 are also formed on the fin active regions 196 and 198. Thus, the gates 222, with adjacent source and drain features and underlying channels, constitute field-effect transistors. The gates 222 are connected to the power lines. Thus configured FETs associated with the gates 222 biased to power lines provide proper FET isolation between adjacent standard cells. Those FETs are also referred to as isolation FETs.

Thirdly, the gates 222 also oriented in the X direction and are discontinuous the N-well 196 to the P-well 198, as illustrated in FIG. 14. Thus, the gates 222 in the N-well 196 are connected to the high power line Vdd, and the associated isolation FETs are pFETs; and the gates 222 in the P-well 198 are connected to the low power line Vss, and the associated isolation FETs are nFETs.

Figure 15:
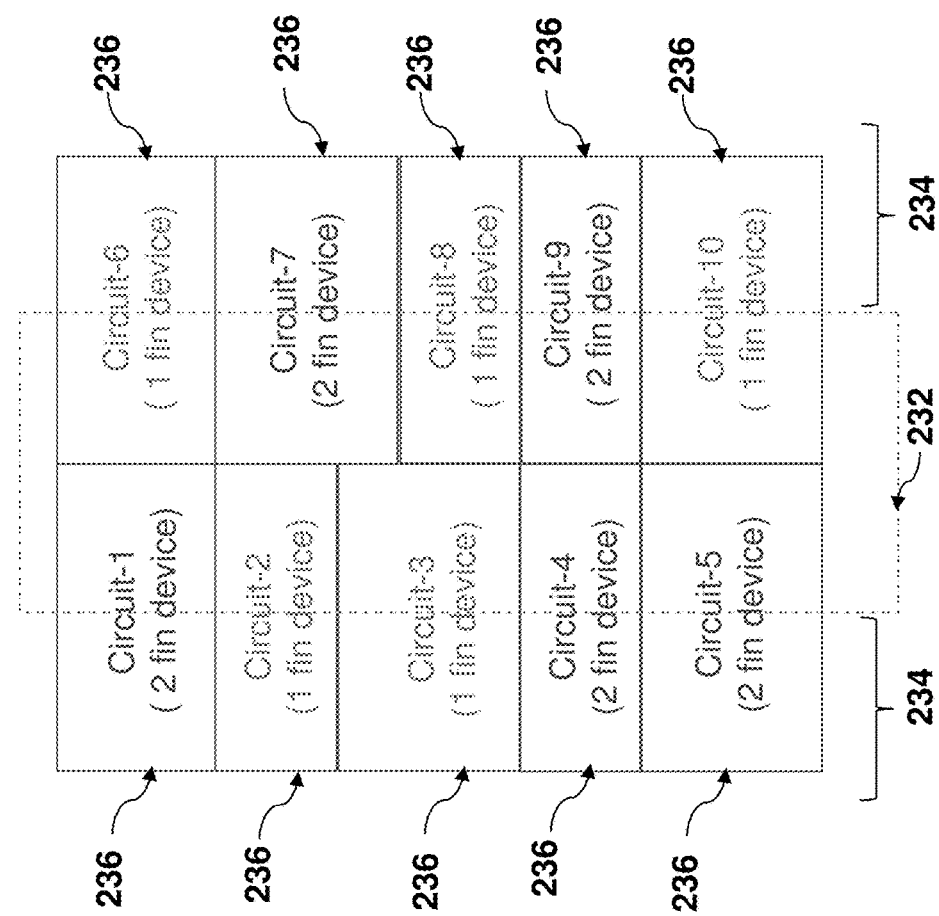
FIG. 15 is a top view of a semiconductor structure having an array of standard circuit cells in accordance with some embodiments.

FIG. 15 is a top view of an integrated circuit 230 constructed in accordance with some embodiments. The integrated circuit 230 includes multiple standard cells configured into a standard cell array. The integrated circuit 230 is one embodiment of the semiconductor structure 100 or 160. Various metal lines and gates are oriented, configured and designed with dimension as described in the semiconductor structure 100 or 160. For example, the thickness of the second metal lines 134 is greater than the thickness of the first metal lines 132 and the thickness of the third metal lines 136.

Particularly, the integrated circuit 230 includes a P-well 232 and two N-wells 234 with the P-well interposed between. Various pFETs are formed in the N-wells 234 and various nFETs are formed in the P-well 232. Those pFETs and nFETs are configured and connected to form various standard cells 236 in array. Those standard cells may include different numbers of FETs and have different dimensions. In the present embodiment, the integrated circuit 230 includes ten standard cells 236 (labeled to "Circuit-1", "Ciorcuit-2", and etc.). For example, the first standard cell includes two fin devices, such as two complimentary FETs (or two CMOS-FETs), each complimentary FET includes an nFET formed in the P-well 232 and a pFET formed in the N-well 234. Those standard cells are configured in an abutment mode. With such a configuration, the standard cells can be arranged more efficiently with high packing density.

Figure 16:
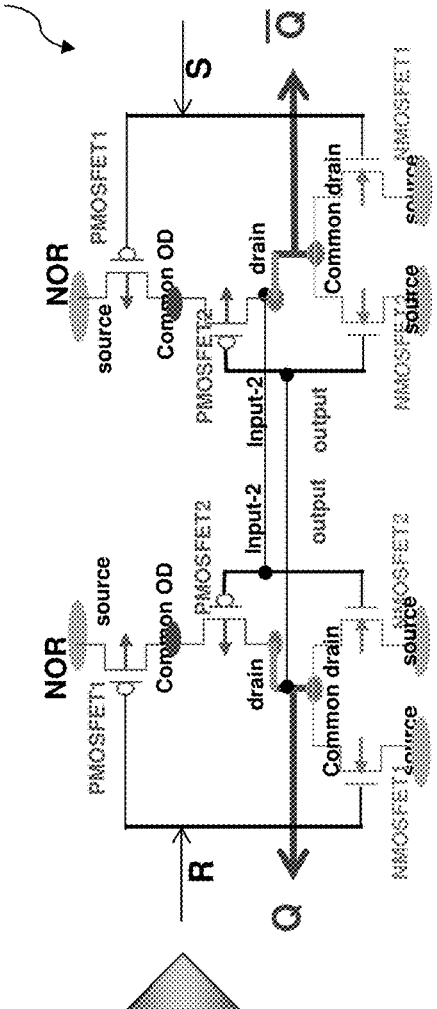
FIG. 16 is a schematic view of a flip-flop cell in accordance with some embodiments.
Figure 16:
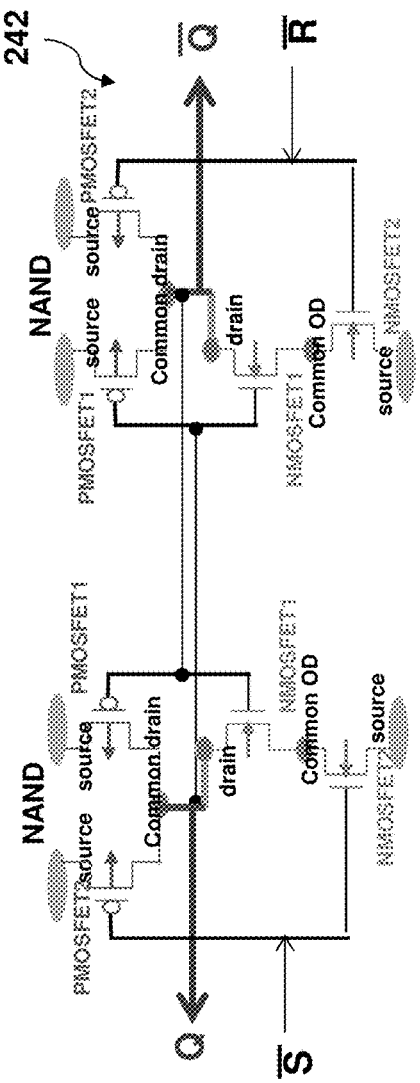
Figure 16:
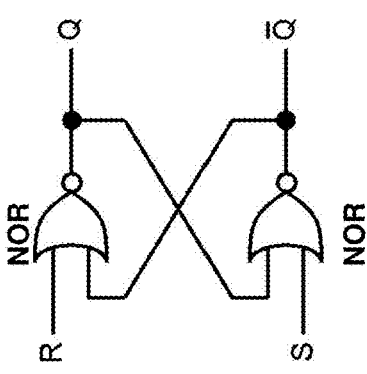
Figure 16:
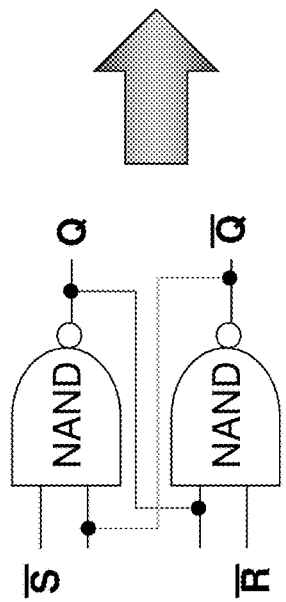

In various embodiments, the standard cells include logic gates, such as an inverter, an NAND logic gate, NOR logic gate. However, the standard cells are not limited to those and may include other standard cells. Those standard cells may be further configured and connected to form another standard cell with a circuit with a different function. For example, a standard cell may be a flip-flop device. FIG. 16 illustrates schematic views of a flip-flop device according two embodiments. The flip-flop device 240 is formed by two NOR logic gates cross-coupled together according to one embodiment. The flip-flop device 242 is formed by two NAND logic gates cross-coupled together according to another embodiment.

Various embodiments are described above, some variations, or alternative may present. As noted before, the gates 110 in the semiconductor structure 100 may be formed by a gate-replacement procedure. The gates 110 and the gate-replacement procedure are further described accordance to some embodiments.

First, one or more dummy gate stack is formed on the semiconductor substrate 102. The dummy gate stack includes a gate dielectric layer and a gate conductive layer on the gate dielectric layer. The formation of the dummy gate stack includes deposition and patterning. The patterning further includes lithography process and etching. A hard mask layer may be further used to pattern the dummy gate stack. In some examples, the gate dielectric layer of the dummy gate stack includes a high k dielectric material layer formed on the semiconductor substrate 102. A capping layer may be formed on the gate dielectric layer. A polysilicon layer as the gate conductive layer is formed on the capping layer. The gate dielectric layer may further include an interfacial layer (IL) interposed between the semiconductor substrate 102 and the high k dielectric material layer. In various examples, the interfacial layer may include silicon oxide formed by a proper technique, such as an atomic layer deposition (ALD), thermal oxidation or UV-Ozone Oxidation. The interfacial layer may have a thickness less than 10 angstrom. The high-k dielectric layer may include metal nitrides or other metal oxides (such as HfO2) and may be formed by a suitable process such as ALD.

The dummy gate material layers are further patterned to form the dummy gate stack by lithography patterning process and etching. A hard mask may be further implemented to pattern the dummy gate material layers. In this case, the hard mask is formed on the dummy gate material layers by deposition and pattering; and one or more etching process is applied to the gate material layers through the openings of the hard mask. The etching process may include dry etching, wet etching or a combination thereof.

In some embodiments, the source and drain may further include light doped drain (LDD) features 262 formed on the substrate 102 and heavily doped source and drain (S/D) features 264 (with the same type conductivity and a doping concentration greater than that of the LDD features), collectively referred to as source and drain. The LDD features 262 and S/D features 264 are formed by respectively ion implantation. One or more thermal annealing process is followed to activate the doped species. In some examples, the source and drain are formed in a doped well 265 (such as an n-type doped well for a PMOS or a p-type doped well for an NMOS). In one example, a gate spacer may be formed on the sidewall of the dummy gate stack. The S/D features are formed on the substrate 102 afterward and are offset from LDD by the gate spacers.

The gate spacer 266 includes one or more dielectric material, such as silicon oxide, silicon nitride, silicon oxynitride or combinations thereof. In one embodiment, the gate spacer 266 includes a seal spacer disposed on the sidewall of the gate stack and a main spacer disposed on the seal spacer, which are formed respectively by a procedure including deposition and etch.

In some examples, the source and drain include doping species introduced to the semiconductor substrate 102 by a proper technique, such as ion implantation. In some examples, the source and drain are formed by epitaxy growth to enhance device performance, such as for strain effect to enhance mobility. In furtherance of the embodiments, the formation of the source and drain includes selectively etching the substrate 102 to form the recesses; and epitaxy growing a semiconductor material in the recesses to form the S/D features 264. The recesses may be formed using wet and/or dry etch process to selectively etch the material of the substrate 102, with proper etchant(s), such as carbon tetrafluoride (CF4), tetramethylammonium hydroxide (THMA), other suitable etchant, or a combination thereof. Thereafter, the recesses are filled with a semiconductor material by epitaxially growing S/D features 412 in crystalline structure. The epitaxy growth may include in-situ doping to form S/D with proper dopant. In yet another embodiment, silicide features may be further formed on the source and drain regions to reduce the contact resistance. The silicide features may be formed by a technique referred to as self-aligned silicide (salicide) including metal deposition (such as nickel deposition) onto a silicon substrate, a thermal anneal to react the metal with silicon to form silicide, and an etch to removed un-reacted metal.

An interlayer dielectric material (ILD) 268 is formed on the substrate and the dummy gate stack. The ILD 268 is deposited by a proper technique, such as CVD. The ILD 268 includes a dielectric material, such as silicon oxide, low k dielectric material or a combination. Then a chemical mechanical polishing (CMP) process may be applied thereafter to polarize the surface of the ILD 268. In one example, the dummy gate stack is exposed by the CMP process for the subsequent processing steps.

The dummy gate stack is completely or partially removed, resulting in a gate trench in the ILD 268. The removal of the dummy gate stack includes one or more etching steps to selectively remove various gate material layers of the dummy gate stack using a suitable etching process, such as one or more wet etch, dry etch or a combination thereof.

Thereafter, various gate material layers are filled in the gate trench, forming a metal gate 110 in the gate trench. In some embodiments such as in high-k last process, the gate material layers includes a gate dielectric layer 270 and a gate conductive layer (or gate electrode) 272. The gate dielectric layer 270 includes a high-k dielectric material. The gate conductive layer 272 includes metal. In some embodiments, the gate conductive layer 272 include multiple layers, such as a capping layer, a work function metal layer, a blocking layer and a filling metal layer (such as aluminum or tungsten). The gate material layers may further include an interfacial layer 274, such as silicon oxide, interposed between the substrate 102 and the high-k dielectric material. The interfacial layer 274 is a portion of the gate dielectric layer. The various gate material layers are filled in the gate trench by deposition, such as CVD, PVD, plating, ALD or other suitable techniques. The high-k dielectric layer 270 includes a dielectric material having the dielectric constant higher than that of thermal silicon oxide, about 3.9. The high k dielectric layer 270 is formed by a suitable process such as ALD. Other methods to form the high k dielectric material layer include MOCVD, PVD, UV-Ozone Oxidation or MBE. In one embodiment, the high k dielectric material includes HfO2. Alternatively, the high k dielectric material layer 270 includes metal nitrides, metal silicates or other metal oxides.

An operation may be applied to remove excessive gate materials and planarize the top surface. For example, a CMP process may be applied to remove the excessive gate materials. After the CMP process, the top surface of the semiconductor structure 100 is planarized. In the present example, various features, including gate 110, source and drain (264) are formed and configured as a field-effect transistor 280.

The gate 110, as described above, may include additional material layers. For example, the gate electrode 272 includes a capping layer, a blocking layer, a work function metal layer, and a filling metal layer. In furtherance of the embodiments, the capping layer includes titanium nitride, tantalum nitride, or other suitable material, formed by a proper deposition technique such as ALD. The blocking layer includes titanium nitride, tantalum nitride, or other suitable material, formed by a proper deposition technique such as ALD. In various embodiments, the filling metal layer includes aluminum, tungsten or other suitable metal. The filling metal layer is deposited by a suitable technique, such as PVD or plating. The work functional metal layer includes a conductive layer of metal or metal alloy with proper work function such that the corresponding FET is enhanced for its device performance. The work function (WF) metal layer is different for a pFET and a nFET, respectively referred to as an n-type WF metal and a p-type WF metal. The choice of the WF metal depends on the FET to be formed on the active region. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. The n-type WF metal may include various metal-based films as a stack for optimized device performance and processing compatibility. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The p-type WF metal may include various metal-based films as a stack for optimized device performance and processing compatibility. The work function metal is deposited by a suitable technique, such as PVD.

Even though only one gate 110 is shown in the figures, however, multiple gate stacks are formed on the substrate 102 for various corresponding nFETs, pFETs and other circuit devices. In some embodiments, the gate 110 is formed on the 3D fin active region and is a portion of a FinFET.

The present disclosure provides various embodiments of a logic circuit and a layout with a multiple metal layer structure and manufacturing method, wherein one or more of the dimensional parameters (thickness, pitch and width) of the second metal lines are greater than the corresponding dimensional parameters of the first and third metal lines. Various advantages may present in various embodiments. By utilizing the disclosed metal configuration layout, the logic circuit has a high packing density. Other advantages may present in various embodiments of the semiconductor structure 100. For examples, with the reduced thicknesses and pitches of the first metal lines 132 and the third metal lines 136, the routing efficiency is increased; the intra-cell coupling capacitance and the power lines resistance are reduced; chip packing density is increased; large pitches are minimized due to the minimum pitch of the second metal lines 134 are substantially aligned with that of the gates 110; and the circuit speed is improved.

Thus, the present disclosure provides a semiconductor structure in accordance with some embodiments. The semiconductor structure includes a semiconductor substrate having active regions; a plurality of field-effect devices disposed on the semiconductor substrate, wherein the field-effect devices include gate stacks with elongated shape oriented in a first direction; a first metal layer disposed over the gate stacks, wherein the first metal layer includes a plurality of first metal lines oriented in a second direction that is orthogonal to the first direction; a second metal layer disposed over the first metal layer, wherein the second metal layer includes a plurality of second metal lines oriented in the first direction; and a third metal layer disposed over the second metal layer, wherein the third metal layer includes a plurality of third metal lines oriented in the second direction. The first metal lines have a first thickness $T_1$, the second metal lines have a second thickness $T_2$, and the third metal lines have a third thickness $T_3$. The second thickness is greater than the first thickness and the third thickness.

The present disclosure provides a semiconductor structure in accordance with some other embodiments. The semiconductor structure includes a semiconductor substrate having a first region for a first standard cell and a second region for a second standard cell, wherein each of the first and second standard cells includes a n-type field-effect transistor and a p-type field effect transistor; a first active region and a second active region formed on the semiconductor substrate, wherein the first and second active regions are isolated from each other by an isolation feature, and wherein the first and second standard cells share an edge on the isolation feature; a first and second gate stacks with elongated shape oriented in a first direction, wherein the first gate stack is disposed on the first active region and the second gate stack is disposed in the second active region; a first and second interconnection gate stacks oriented in the first direction, wherein the first interconnection gate stack is partially landing on the first active region and partially landing on the isolation feature, and the second interconnection gate stack is partially landing on the second active region and partially landing on the isolation feature; a first metal layer disposed over the first and second gate stacks, wherein the first metal layer includes a plurality of first metal lines oriented in a second direction being orthogonal to the first direction; a second metal layer disposed over the first metal layer, wherein the second metal layer includes a plurality of second metal lines oriented in the first direction; and a third metal layer disposed over the second metal layer, wherein the third metal layer includes a plurality of third metal lines oriented in the second direction. The first metal lines have a first thickness $T_1$, the second metal lines have a second thickness $T_2$, the third metal lines have a third thickness $T_3$, and a first thickness ratio $T_2/T_1$ is greater than 1.2, a second thickness ratio $T_2/T_3$ is greater than 1.2. The semiconductor structure includes a semiconductor substrate having active regions; a plurality of field-effect devices disposed on the semiconductor substrate, wherein the field-effect devices include gate stacks with elongated shape oriented in a first direction; a first metal layer disposed over the gate stacks and having a first thickness $T_1$, wherein the first metal layer includes a plurality of first metal lines oriented in a second direction that is orthogonal to the first direction; a second metal layer disposed over the first metal layer and having a second thickness $T_2$, wherein the second metal layer includes a plurality of second metal lines oriented in the first direction; a third metal layer disposed over the second metal layer and having a third thickness $T_3$, wherein the third metal layer includes a plurality of third metal lines oriented in the second direction; a fourth metal layer disposed over the third metal layer and having a forth thickness $T_4$, wherein the fourth metal layer includes a plurality of fourth metal lines oriented in the first direction; a fifth metal layer disposed over the forth metal layer and having a fifth thickness $T_5$, wherein the fifth metal layer includes a plurality of fifth metal lines oriented in the second direction; a sixth metal layer disposed over the fifth metal layer and having a sixth thickness $T_6$, wherein the sixth metal layer includes a plurality of sixth metal lines oriented in the first direction; first via features vertically connecting between the first metal lines and the second metal lines; second via features vertically connecting between the second metal lines and the third metal lines; third via features vertically connecting between the third metal lines and the fourth metal lines; fourth via features vertically connecting between the fourth metal lines and the fifth metal lines; and fifth via features vertically connecting between the fifth metal lines and the sixth metal lines. A first thickness ratio $T_2/T_1$ is greater than 1.2; a second thickness ratio $T_2/T_3$ is greater than 1.2; a third thickness ratio $T_5/T_2$ is greater than 1.2; a forth thickness ratio $T_6/T_5$ is less than 1.1; and the fourth via features have a first width and the fifth via features have a second width, and a ratio of the second width over the first width is greater than 1.5.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
a substrate having a first region and a second region;
a first active region disposed in the first region of the substrate;
a second active region disposed in the second region of the substrate;
a first gate stack disposed over the first active region and a second gate stack disposed over the second active region, wherein the first gate stack and the second gate stack have elongated shapes oriented in a first direction;
a first dielectric gate stack disposed between the first region and the second region of the substrate, the first dielectric gate stack electrically isolating the first region from the second region of the substrate;
a first metal layer disposed over the first and second gate stacks, wherein the first metal layer includes a plurality of first metal lines oriented in a second direction being orthogonal to the first direction;
a second metal layer disposed over the first metal layer, wherein the second metal layer includes a plurality of second metal lines oriented in the first direction; and
a third metal layer disposed over the second metal layer, wherein the third metal layer includes a plurality of third metal lines oriented in the second direction, and
wherein the second metal lines have a first minimum pitch $P_1$,
wherein the first metal lines have a second minimum pitch $P_2$,
wherein the third metal lines have a third minimum pitch $P_3$,
wherein the third minimum pitch $P_3$ equals to the second minimum pitch $P_2$,
wherein the first minimum pitch $P_1$ is greater than the second minimum pitch $P_2$, and
wherein the first minimum pitch $P_1$ is greater than the third minimum pitch $P_3$.

2. The device of claim 1, wherein each of the first metal lines have a first thickness $T_1$, wherein each of the second metal lines have a second thickness $T_2$, wherein each of the third metal lines have a third thickness $T_3$,
wherein a first thickness ratio $T_2/T_1$ is equal to or greater than 1.2, and
wherein a second thickness ratio $T_2/T_3$ is equal to or greater than 1.2.

3. The device of claim 1, wherein the first gate stack in the first region is part of an inverter, and
wherein the second gate stack in the second region is part of either a NAND logic gate stack or a NOR logic gate stack.

4. The device of claim 1, further comprising:
a third active region disposed in a third region of the substrate;
a third gate stack disposed over the third active region; and
a second dielectric gate stack disposed between the second region and the third region of the substrate, the second dielectric gate stack electrically isolating the second region from the third region of the substrate.

5. The device of claim 4, wherein the first gate stack in the first region is part of an inverter,
wherein the second gate stack in the second region is part of a NAND logic gate stack; and
wherein the third gate stack in the third region is part of a NOR logic gate stack.

6. The device of claim 1, further comprising:
a third active region disposed in the first region of the substrate;
a dielectric isolation structure disposed on the substrate between the first active region and the third active region, and
wherein the first gate stack extends from the first active region to the third active region, and wherein the first gate stack disposed over the first active region is part of a first n-type field-effect transistor and wherein the first gate stack disposed over the third active region is part of a first p-type field-effect transistor.

7. The device of claim 1, further comprising:
a fourth active region disposed in the second region of the substrate;
the dielectric isolation structure disposed on the substrate between the second active region and the fourth active region, and
a third gate stack disposed over the second active region and extending to the fourth active region,
wherein the second gate stack extends from the second active region to the fourth active region, and
wherein the second gate stack disposed over the second active region is part of a second n-type field-effect transistor and wherein the second gate stack disposed over the fourth active region is part of a second p-type field-effect transistor, and
wherein the third gate stack disposed over the second active region is part of a third n-type field-effect transistor and wherein the third gate stack disposed over the fourth active region is part of a third p-type field-effect transistor.

8. The device of claim 1, wherein at least one of the first metal lines has a first thickness $T_1$, wherein at least one of the second metal lines has a second thickness $T_2$,
wherein at least one of the third metal line has a third thickness $T_3$, and
wherein the second thickness $T_2$ is greater than the first thickness $T_1$ and wherein the second thickness $T_2$ is greater than the third thickness $T_3$.

9. The device of claim 1, wherein the second metal lines have a first width $W_1$, and
wherein the first gate includes a plurality of first gates having a second width $W_2$ and a fourth minimum pitch $P_4$, and
wherein the fourth minimum pitch $P_4$ is different than first minimum pitch $P_1$ of the second metal lines.

10. A device comprising:
a substrate having a first region, a second region and a third region;
a first active region disposed in the first region of the substrate;
a second active region disposed in the second region of the substrate;
a third active region disposed in the third region of the substrate;
a first gate stack disposed over the first active region in the first region, a second gate stack disposed over the second active region in the second region and a third gate stack disposed over the third active region in the third region, wherein the first gate stack, the second gate stack and the third gate stack have elongated shapes oriented in a first direction;
a first metal layer disposed over the first, second and third gate stacks, wherein the first metal layer includes a first metal line oriented in a second direction being orthogonal to the first direction;
a second metal layer disposed over the first metal layer, wherein the second metal layer includes a second metal line oriented in the first direction; and
a third metal layer disposed over the second metal layer, wherein the third metal layer includes a third metal line oriented in the second direction, and wherein the first metal line includes a plurality of first metal lines having a first thickness $T_1$, the second metal line includes a plurality of second metal lines having a second thickness $T_2$, the third metal line includes a plurality of third metal lines having a third thickness $T_3$, and wherein the second thickness $T_2$ is greater than the first thickness $T_1$ and wherein the second thickness $T_2$ is greater than the third thickness $T_3$,
wherein the second metal lines have a first minimum pitch $P_1$,
wherein the first metal lines have a second minimum pitch $P_2$,
wherein the third metal lines have a third minimum pitch $P_3$,
wherein the third minimum pitch $P_3$ equals to the second minimum pitch $P_2$,
wherein the first minimum pitch $P_1$ is greater than the second minimum pitch $P_2$, and
wherein the first minimum pitch $P_1$ is greater than the third minimum pitch $P_3$.

11. The device of claim 10, further comprising a first isolation gate stack disposed between the first region and the second region of the substrate, the first isolation gate stack connected to a first power line such that the first isolation gate stack biased to the first power line isolates the first region of the substrate from the second region of the substrate.

12. The device of claim 11, wherein the first isolation gate stack includes a first portion disposed over the first active region.

13. The device of claim 10, further comprising a second isolation gate stack disposed between the second region and the third region of the substrate, the second isolation gate stack connected to a second power line such that the second isolation gate stack biased to the second power line isolates the second region of the substrate from the third region of the substrate.

14. The device of claim 10, wherein the first gate stack in the first region is part of an inverter,
wherein the second gate stack in the second region is part of a NAND logic gate stack; and
wherein the third gate stack in the third region is part of a NOR logic gate stack.

15. The device of claim 10, wherein at least one of the first metal lines has a first thickness $T_1$, wherein at least one of the second metal lines has a second thickness $T_2$,
wherein at least one of the third metal lines has a third thickness $T_3$, and
wherein the second thickness $T_2$ is greater than the first thickness $T_1$ and wherein the second thickness $T_2$ is greater than the third thickness $T_3$.

16. The device of claim 10, wherein the second metal lines have a first width $W_1$, and
wherein the first gate includes a plurality of first gates having a second width $W_2$ and a fourth minimum pitch $P_4$, and
wherein the fourth minimum pitch $P_4$ is different than first minimum pitch $P_1$ of the second metal lines.

17. A device comprising:
a substrate having a first region, a second region and a third region;
an inverter disposed on the first region of the substrate;
a logic NAND gate stack disposed on the second region of the substrate;
a logic NOR gate stack disposed on the third region of the substrate;

a first gate stack disposed between the first region and the second region of the substrate, the first gate stack contributing to electrically isolating the first region from the second region;

a second gate stack disposed between the second region and the third region of the substrate, the second gate stack contributing to electrically isolating the second region from the third region, wherein the first gate stack and the second gate stack have elongated shapes oriented in a first direction;

a first metal layer disposed over the first and second gate stacks, wherein the first metal layer includes a plurality of first metal lines oriented in a second direction being orthogonal to the first direction;

a second metal layer disposed over the first metal layer, wherein the second metal layer includes a plurality of second metal lines oriented in the first direction; and a third metal layer disposed over the second metal layer, wherein the third metal layer includes a plurality of third metal lines oriented in the second direction, and wherein the second metal lines have a first minimum pitch $P_1$, wherein the first metal lines have a second minimum pitch $P_2$, wherein the third metal lines have a third minimum pitch $P_3$, wherein the third minimum pitch $P_3$ equals to the second minimum pitch $P_2$, wherein the first minimum pitch $P_1$ is greater than the second minimum pitch $P_2$, and wherein the first minimum pitch $P_1$ is greater than the third minimum pitch $P_3$.

18. The device of claim 17, wherein each of the first metal lines have a first thickness $T_1$, wherein each of the second metal lines have a second thickness $T_2$, wherein each of the third metal lines have a third thickness $T_3$, wherein a first thickness ratio $T_2/T_1$ is equal to or greater than 1.2, wherein a second thickness ratio $T_2/T_3$ is equal to or greater than 1.2, and wherein a third thickness ratio $T_3/T_1$ equals to 1.

19. The device of claim 17, wherein the first gate stack is a first dielectric gate stack and the second gate stack is a second dielectric gate stack.

20. The device of claim 17, wherein the first gate stack is a first isolation gate stack, the first isolation gate stack connected to a first power line such that the first isolation gate stack biased to the first power line isolates the first region of the substrate from the second region of the substrate.

* * * * *